(12) United States Patent
Marasas, Jr.

(10) Patent No.: US 10,334,725 B1
(45) Date of Patent: Jun. 25, 2019

(54) ADHESIVE BASED RECONFIGURABLE ELECTRONIC CIRCUIT BUILDING SYSTEM

(71) Applicant: Richard A. Marasas, Jr., San Jose, CA (US)

(72) Inventor: Richard A. Marasas, Jr., San Jose, CA (US)

( * ) Notice: Subject to any disclaimer, the term of this patent is extended or adjusted under 35 U.S.C. 154(b) by 904 days.

(21) Appl. No.: 14/683,028

(22) Filed: Apr. 9, 2015

Related U.S. Application Data

(60) Provisional application No. 61/978,109, filed on Apr. 10, 2014.

(51) Int. Cl.
  *H05K 1/02* (2006.01)
  *H01M 2/30* (2006.01)
  *H05K 1/11* (2006.01)
  *H05K 1/09* (2006.01)
  *H01H 1/36* (2006.01)

(52) U.S. Cl.
  CPC ............ *H05K 1/0286* (2013.01); *H01H 1/36* (2013.01); *H01M 2/30* (2013.01); *H05K 1/0266* (2013.01); *H05K 1/0296* (2013.01); *H05K 1/09* (2013.01); *H05K 1/092* (2013.01); *H05K 1/111* (2013.01); *H05K 1/115* (2013.01); *H05K 2201/10037* (2013.01)

(58) Field of Classification Search
  CPC .... H05K 1/02286; H05K 1/0296; H05K 1/09; H05K 1/092; H05K 1/111; H05K 1/115; H05K 2201/10037; H01H 1/36; H01M 2/30; H01L 23/02–23/10
  See application file for complete search history.

(56) References Cited

U.S. PATENT DOCUMENTS

| | | | |
|---|---|---|---|
| 3,548,261 | A | 12/1970 | Chambers |
| 3,633,074 | A | 1/1972 | Nopri |
| 3,694,931 | A | 3/1972 | Bialek |
| D228,136 | S | 8/1973 | Portugal |
| 4,010,555 | A | 3/1977 | Paulsson |

(Continued)

OTHER PUBLICATIONS

Buechley, L, Hendrix, S., and Eisenberg, M., "Paints, paper, and programs: first steps toward the computational sketchbook", Proceedings of the 3rd International Conference on Tangible and Embedded Interaction (TEI '09) ACM (2009) pp. 9-12, Association for Computing Machinery, New York, NY.

(Continued)

*Primary Examiner* — Kevin R Kruer

(57) ABSTRACT

A system for assembling electronic circuits on an electrically non-conductive surface or substrate. The system incorporates electronic components integrated into electronic component modules. The electronic component modules include identification markings on the top surfaces and electronic contact pads on the bottom surfaces. Electrical interconnects between discrete electronic component modules is achieved through the use of electrically conductive traces placed on the substrate surface. The bottom surfaces of the electronic component modules are coated with an adhesive so the electronic component modules can be mounted onto the substrate. The electronic component modules are affixed to the substrate such that the electronic component modules contact pads make electrical contact with the appropriate electrically conductive traces.

13 Claims, 34 Drawing Sheets

(56) References Cited

U.S. PATENT DOCUMENTS

| | | | |
|---|---|---|---|
| 4,110,917 A | 9/1978 | Le Grelle | |
| 5,742,486 A | 4/1998 | Yangkuai | |
| 8,497,162 B1* | 7/2013 | Too | H01L 23/10 438/118 |
| 2002/0127379 A1* | 9/2002 | Suzuki | H05K 1/0366 428/209 |
| 2005/0073044 A1* | 4/2005 | Tomabechi | H01L 21/4857 257/720 |
| 2005/0152101 A1* | 7/2005 | Rodriguez | H05K 7/20272 361/605 |
| 2005/0205291 A1* | 9/2005 | Yamashita | H05K 3/20 174/254 |
| 2006/0244111 A1* | 11/2006 | Kuwahara | H01R 43/007 257/668 |
| 2006/0278962 A1* | 12/2006 | Gibson | H01L 23/4985 257/668 |
| 2007/0268674 A1* | 11/2007 | Bauer | H01L 23/3128 361/730 |
| 2008/0036077 A1* | 2/2008 | Wang | H01L 23/36 257/717 |
| 2010/0304580 A1* | 12/2010 | Baycura | H05K 1/0286 439/65 |
| 2011/0292621 A1* | 12/2011 | Beaumier | H01L 23/055 361/748 |
| 2012/0044025 A1* | 2/2012 | Nakamura | B81B 7/007 331/158 |
| 2013/0307124 A1* | 11/2013 | Wada | H01L 21/78 257/620 |
| 2013/0313700 A1* | 11/2013 | Hooper | B81B 7/0064 257/704 |
| 2014/0217566 A1* | 8/2014 | Goida | H01L 23/04 257/676 |
| 2014/0241388 A1* | 8/2014 | Yamanaka | H01S 5/02212 372/43.01 |
| 2015/0096792 A1* | 4/2015 | Ogawa | H01G 2/06 174/255 |
| 2016/0295707 A1* | 10/2016 | Takano | H05K 3/4069 |
| 2017/0135240 A1* | 5/2017 | Pahl | H01L 23/10 |
| 2017/0271306 A1* | 9/2017 | Wang | H01L 25/043 |
| 2017/0358542 A1* | 12/2017 | Yeh | H01L 23/562 |

OTHER PUBLICATIONS

Freed, N., Qi, J., Setapen, A., Breazeal, C., Buechley, L and Raffle, H., "Sticking together: handcrafting personalized communication interfaces", Proceedings of ACM IDC11 Interaction Design and Children (2011) pp. 238-241, Association for Computing Machinery, New York, NY.

Perner-Wilson, Hannah, "A Kit-of-No-Parts", MS Thesis, Media Arts and Sciences, School of Architecture and Planning, Massachusetts Institute of Technology (2011), Massachusetts Institute of Technology, Cambridge, MA.

Qi, Jie, "The Fine Art of electronics: Paper-based Circuits for Creative Expression" MS Thesis, Media Arts and Sciences, School of Architecture and Planning, Massachusetts Institute of Technology (2012), Massachusetts Institute of Technology, Cambridge, MA.

Wilkinson, K. and Petrich, M., "Electronic Popables, The art of Tinkering", (2013) pp. 75-79, Weldon Owen, San Francisco, CA.

* cited by examiner

ADHESIVE BASED RECONFIGURABLE ELECTRONIC CIRCUIT BUILDING SYSTEM

CROSS-REFERENCE TO RELATED APPLICATIONS

This application claims the benefit of provisional patent application Ser. No. 61/978,109, filed 2014 Apr. 10 by the present inventor.

BACKGROUND

Prior Art

The following is a tabulation of some prior art that presently appears relevant:

| U.S. Patents | | | |
|---|---|---|---|
| Pat. No. | Kind Code | Issue Date | Patentee |
| 5,742,486 | | 1998 Apr. 21 | Yangkuai |
| 4,110,917 | | 1978 Sep. 5 | Le Grelle |
| 4,010,555 | | 1977 Mar. 8 | Paulsson |
| Des. 235,554 | | 1975 Jun. 24 | Portugal |
| 3,694,931 | | 1972 Oct. 3 | Bialek |
| 3,633,074 | | 1972 Jan. 4 | Nojiri |
| 3,548,261 | | 1970 Dec. 15 | Chambers |

Nonpatent Literature Documents

Buechley, L., Hendrix, S., and Eisenberg, M., "Paints, paper, and programs: first steps toward the computational sketchbook", Proceedings of the $3^{rd}$ International Conference on Tangible and Embedded Interaction (TEI '09) ACM, New York, N.Y. (2009) pgs. 9-12.

Freed, N., Qi, J., Setapen, A., Breazeal, C., Buechley, L. and Raffle, H., "Sticking together: handcrafting personalized communication interfaces", Proceedings of ACM IDC11 Interaction Design and Children (2011) pp. 238-241.

Perner-Wilson, Hannah, "A Kit-of-No-Parts", MS Thesis, Media Arts and Sciences, School of Architecture and Planning, Massachusetts Institute of Technology (2011)

Qi, Jie, "The Fine Art of electronics: Paper-based Circuits for Creative Expression" MS Thesis, Media Arts and Sciences, School of Architecture and Planning, Massachusetts Institute of Technology (2012)

Wilkinson, K. and Petrich, M., "Electronic Popables", The art of Tinkering, (2013) pgs. 75-79, Weldon Owen, San Francisco, Calif.

BACKGROUND

Discussion of Prior Art

Since the advent of modern electronics there has been both an interest and a need to rapidly assemble electronic circuits without the use of soldering. Over the years various breadboarding systems have been developed which allowed discrete electronic components to be electrically connected without the need to solder the components together.

Early systems utilized electronic components mounted on or in blocks with plural legs which were inserted into an electronics board with many mounting holes. Electrical interconnection between electronic components in such systems was achieved through connecting wires between the blocks via mechanical connectors or plug and socket mechanisms.

In more recent decades breadboard apparatus such as disclosed in U.S. Pat. No. Des. 228,136 have become popular for electronic breadboarding applications. This type of breadboard apparatus has an electrically non-conductive housing of, for example injection molded plastic or plastic like material, formed with a plurality of compartments with each typically having an opening in a top housing surface for access to the compartment usually by insertion of an electrical lead or the like thereof. An electrical contact is positioned in each compartment to connect electrically with an electrical lead inserted therein. Adjacent compartments in this type of apparatus are grouped and electrically connected. In using a breadboard apparatus such as this electronic components are connected to one another by inserting a component lead of the first component into one of the compartments of the breadboard and then inserting into an adjacent and electrically connected compartment the lead of the second electronic component. In doing this the leads of the electronic components are often bent over such that the overall shape of the component and it's leads is a U shape. While electrical circuits can be assembled using such a breadboard it can be difficult to trace individual elements of the circuit because of the inherent three dimensional nature of the components with their leads bent over to be inserted into the compartments of the breadboard.

In more recent years as an offshoot of the field of printed electronics conductive ink printing on paper has been developed. Utilizing this technology the conductive traces of a circuit layout can be printed on a sheet of paper using a specialty printer. Alternatively the conductive traces can be manually drawn on the paper utilizing a conductive ink pen. Electronic components can then be mounted onto the printed circuit by attaching the leads of the electronic components to the conductive traces by using a conductive glue. A disadvantage of this technique is that the user must wait for the conductive glue to dry to both secure the component to the circuit and for the glue itself to become conductive. For some time other techniques for forming temporary electronic circuits on paper have been known to those skilled in the art. In these techniques conductive tape is used to create conductive traces on the paper and the leads of the electronic components used in the circuit are either glued, soldered, or mechanically held in contact with the conductive tape. To mechanically hold the component in electrical contact paperclips, binder clips, or ordinary adhesive tape are typically employed. The disadvantages of these techniques include that soldering components on paper is inconvenient and a fire hazard, mechanical means to hold the components in place such as paperclips and ordinary tape are insecure and with movement and vibration subject to physical separation and loss of electrical contact. Other techniques proposed to hold electrical components in place in such circuits have included the use of a combination of magnetic paint and magnets.

SUMMARY OF THE INVENTION

The current invention encompasses a system of repositionable electronic component modules for use on an electrically non-conductive substrate to rapidly build, test, and reconfigure electronic circuits. The current invention includes three basic constituents, a substrate, one or more electrically conductive traces, and one or more electronic component modules. The substrate of the current invention provides a surface onto which the conductive traces and electronic component modules are attached. The electrically conductive traces mounted on the substrate provide electrical interconnections between the repositionable electronic component modules of the current invention. The electronic component modules of the current invention facilitate the incorporation of a variety of electronic components which can be interconnected by the conductive traces to form an electronic circuit on the substrate.

The electronic component modules of the current invention facilitate the incorporation of a variety of electronic components including discrete electronic components as well as integrated circuits. The electronic component modules form a housing comprising of a base, a spacer, and a cover. In a given electronic component module the electronic component is mounted on the base of electronic component module with conduction leads connecting the electrical contacts of the electronic component through vias in the base to electrical contact pads on the underside of the base. The underside surface of the base except where the contact pads are located is coated with a repositionable adhesive. The adhesive enables the electronic component module to be affixed to the substrate. The spacer of the electronic component module supports the electronic component module cover and along with the electronic component module cover encloses and protects the enclosed electronic component. Identification markings are provided on the top surface of the electronic component module cover and are used to identify the type, orientation, and properties of the electronic component mounted inside the electronic component module.

To form electronic circuits the electronic component modules of the current invention are interconnected via electrically conductive traces placed or deposited on the substrate surface.

The substrate of the current invention provides structural support for the circuit as well as provides a surface which is both electrically non-conductive and facilitates adhesion of the conductive traces as well as the electronic component modules. The substrate can either be flexible or rigid depending on the design needs for the circuit. The conductive traces utilized in the current invention can be created in a variety of manners from an assortment of materials such as graphite pencils, conductive inks, metal tapes, or conducting polymers. As stated above the bottom surfaces of the electronic component modules are coated with an adhesive so that the electronic component modules can be mounted onto the substrate. Once the conductive traces are placed onto the substrate the electronic component modules are mounted onto the substrate over the conductive traces. The electronic component modules are affixed to the substrate such that the electronic component modules contact pads make electrical contact with the appropriate conductive traces.

DRAWINGS

The present invention may be better understood, and its numerous features and advantages made apparent to those skilled in the art by referencing the accompanying drawings. For ease of understanding and simplicity, common numbering of elements within the illustrations is employed where an element is the same in different drawings.

DETAILED DESCRIPTION

The following is a detailed description of illustrative embodiments of the present invention. As these embodiments of the present invention are described with reference to the aforementioned drawings, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. For example, the devices set forth herein are characterized as an educational toy, but it is apparent that professional and training uses may be also found for these devices. Hence, these descriptions and drawings are not to be considered in a limiting sense as it is understood that the present invention is in no way limited to the embodiments illustrated.

The present invention provides an educational toy for use in learning about and building electronic circuits. More specifically the present invention encompasses a system of repositionable electronic circuit components for use on a paper or other suitable substrate to rapidly build, test, and reconfigure electronic circuits.

Most toys or devices for use in teaching electronic circuits involve the need to solder electronic components together or connect them via mechanical physical connectors. Such toys or devices add a layer of complexity to the process of learning about electronic circuits which interferes with the learning process and cause the user to lose interest over time due to the added difficulty of connecting components together.

This invention provides a new way in which to lay out, study, and build functioning electronic circuits. An electronic circuit is typically composed of three primary components, a substrate, conductive traces or electrical interconnections, and individual electronic components. In an electronic circuit the substrate provides a platform on which to mount or place the conductive traces and electronic components. The conductive traces allow electronic signals to be propagated between the electronic components of the circuit while the electronic components in turn modify the transmitted electronic signals as they pass through the various electronic components of the circuit.

Substrate

Figure 1:
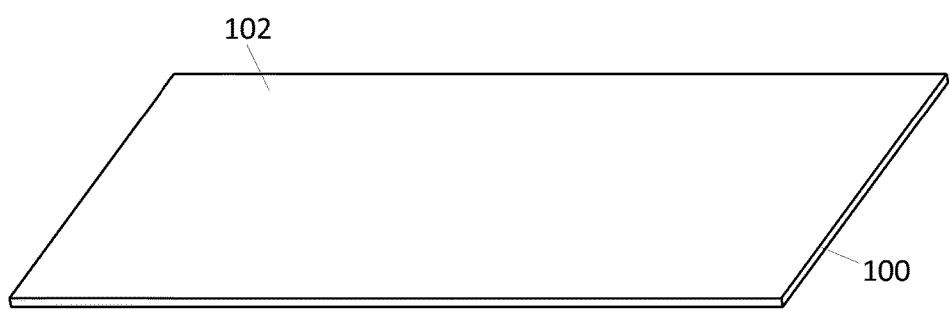
FIG. 1 is a perspective view from above of a blank substrate in accordance with the current invention.

The current invention incorporates a substrate onto which conductive traces and electronic components are attached. In one embodiment of the current invention the substrate is made from paper. FIG. 1 is a perspective view of a substrate 100 in accordance with the present invention. The substrate 100 must provide structural support for the circuit, as well as have a surface 102 which is both electrically non-conductive and facilitates adhesion. In providing structural support the substrate 100 can either be flexible or rigid depending on the design needs for the circuit. The thickness of the paper used in the current invention will determine the rigidity of the substrate. In another embodiment of the current invention the substrate 100 is made from a very thick form of paper referred to as card stock. Card stock is desirable when making larger circuits which require structural support over larger surface areas. In another embodiment of the current invention the substrate 100 is made from a very thick form of paper referred to as paperboard. Paperboard like card stock is desirable when making larger circuits which require structural support over larger surface areas. In another embodiment of the current invention the substrate 100 can be made from cardboard. Cardboard also provides enhanced rigidity over an extended surface area while maintaining a low relative weight by incorporating a corrugated structure in its core.

As stated above the substrate surface 102 of the current invention is required to be electrically non-conductive to prevent unintended electrical connections between electronic components and conductive traces which will be mounted on the substrate surface. Paper, card stock, paperboard, and cardboard are all acceptable as substrate materials in the current invention in that unless their surfaces are specially coated their surfaces are electrically non-conductive. Another requirement stated above is that the substrate surface 102 must facilitate adhesion. Since there exist today many good adhesives which can bond almost any material to another material this requirement is not as critical as the others previously mentioned however, it is important that the substrate surface be relatively smooth to facilitate the adhesion of conductive traces and electronic components to its surface.

Other non-conductive material such as fiberglass which is used in traditional circuit boards and various plastics may also be used to form a substrate 100 in accordance with the current invention. Advantages to using fiberglass as a substrate material include strength and rigidity however a key disadvantage to using fiberglass is its cost, especially compared to paper, paperboard, or card stock. The use of plastic as a substrate material also has advantages as well as disadvantages. Like fiberglass, a sheet of plastic can be strong, rigid, and lightweight however its relative cost is also higher than paper or card stock. In addition, certain plastics also have an undesirable property in that they can build up and retain a static electric charge. This charge buildup in the plastic can provide an unwanted electrical capacitance which can adversely affect any circuit assembled on its surface. The size and thickness of the substrate 100 in the current invention will depend on a user's application and the material properties of the substrate material as described above.

Description of Conductive Traces

Figure 2:
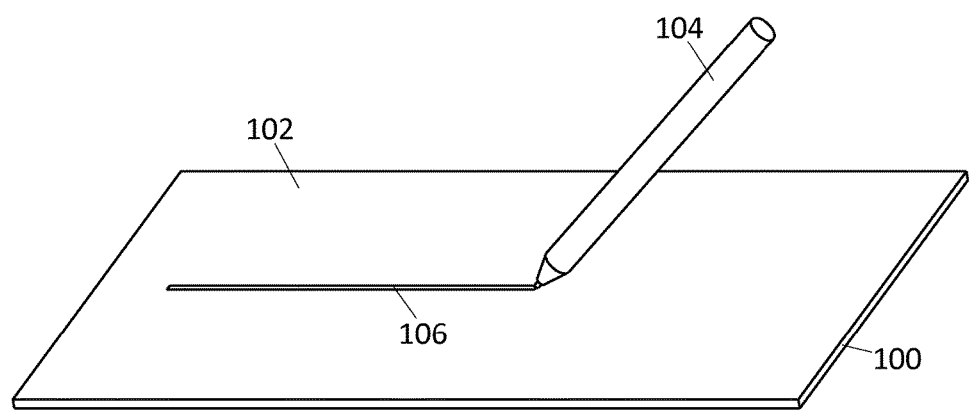
FIG. 2 is a perspective view from above of a substrate on which an electrically conductive trace is being drawn.

Conductive traces are placed on the substrate surface to provide electrical conduction between individual electrical components mounted on the substrate surface. Therefore, the conductive traces in turn need to be electrically conductive. Conductive traces can be created in a variety of manners from an assortment of materials such as graphite pencils, conductive inks, metal, or conducting polymers. Graphite pencils can produce a conductive trace on a surface through the action of rubbing the graphite core of the pencil on the substrate surface. Through this action overlapping flakes of electrically conductive graphite are left behind on the surface. While graphite pencils can produce conductive traces these traces are only moderately electrically conductive. More recently conductive inks and conductive ink pens have been developed. Conductive ink pens have been used for many years to repair and modify circuit boards. More recently conductive inks have been used in the relatively new field of printed electronics. In the current invention a conductive ink pen can be used to create an electrically conductive trace on the substrate surface. FIG. 2 is a perspective view which shows an embodiment of the current invention wherein a conductive ink pen 104 is used to apply a conductive trace 106 onto the substrate surface 102. To produce an electrically conductive trace the ink used in a conductive ink pen 104 must become electrically conductive once applied to the substrate. Using a conductive ink pen 104 to produce electrically conductive traces allows for the layout of electrically conductive traces of arbitrary complexity and geometry.

Figure 3:
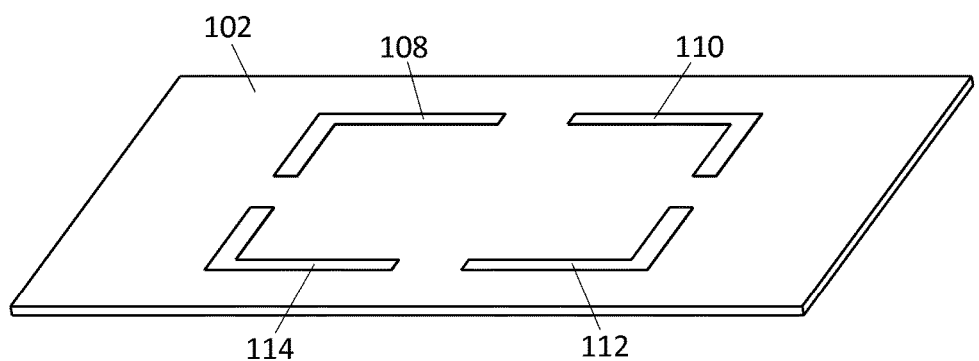
FIG. 3 is a perspective view from above of a substrate on which electrically conductive traces have been printed.

Conductive ink traces can also be printed onto a substrate surface. In another embodiment of the current invention the conductive ink traces are printed on the substrate surface. FIG. 3 shows a perspective view of an example of a conductive trace geometry printed onto a substrate surface 102 with multiple arbitrarily shaped conductive traces 108, 110, 112, and 114. There are many different printing techniques which could be used to print the conductive ink onto the substrate. The particular technique used depends on the both the composition of the substrate and the type of conductive ink used. Some of these printing techniques include screen printing, flexographic, gravure, and inkjet which are all well-known and currently used in the printed electronics industry. One drawback to using conductive inks is that once deposited onto the substrate surface many conductive inks require either time and or heat to cure and or dry before becoming usable. The time and or equipment required to cure and or dry a conductive ink may be a disadvantage to a user who wishes to use the drawn or printed conductive traces immediately.

Conductive Traces Made with Conductive Metal Strips

Figure 4:
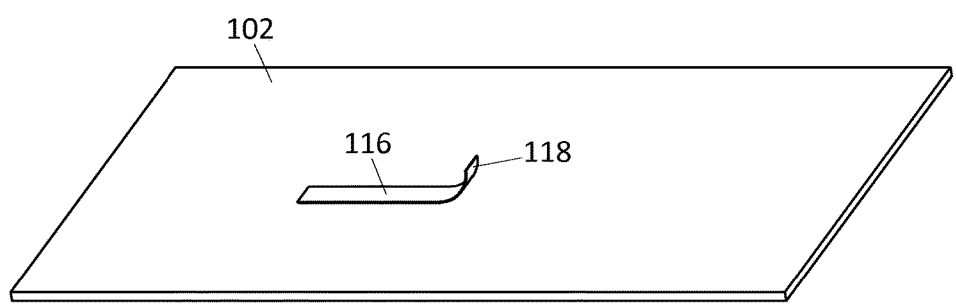
FIG. 4 is a perspective view from above of a substrate on which electrically conductive tape is being applied.
Figure 5:
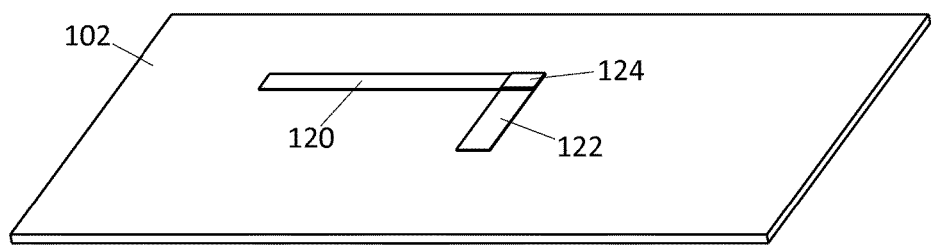
FIG. 5 is a perspective view from above of overlapping strips of electrically conductive tape affixed to a substrate.

To overcome the limitations of electrically conductive inks one embodiment in accordance with the current invention is to form the conductive traces from thin conductive metal strips which are then affixed to the substrate surface with an adhesive. An example of such a material is copper tape. Copper tape is a desirable embodiment of the current invention to form conductive traces on the substrate. Copper tape has been used for years in the electronics industry to both form simple circuits traces and repair circuit boards with broken or missing traces. FIG. 4 is a perspective view from above which shows a conductive metal strip 116 being applied to the substrate surface 102 to form a conductive metal trace on the substrate. To attach the conductive metal strip 116 to the substrate the underside of the conductive metal strip is coated with an electrically conductive adhesive 118. The electrically conductive adhesive 118 serves two purposes, first it acts as an adhesive which allows the conductive metal strip to be affixed to the surface of the substrate, second it allows multiple conductive metal strips to be attached to one another to form a continuous electrically conductive path. FIG. 5 is a perspective view from above which shows two conductive metal strips 120, 122 attached both to a substrate surface 102 and to each other. The conductive metal strips 120, 122 form a continuous electrically conductive path by having their ends overlap 124. The conductive metal strips 120, 122 overlap by having the end of one strip lay on top of the end of the other metal strip. When the ends of the two metal strips overlap they are physically bonded to each other through the electrically conductive adhesive on the underside of the upper metal strip. In addition to being physically attached an electrically conductive pathway is formed from one metal strip to the other through the electrically conductive adhesive. In this manner an electrically conductive pathway of an arbitrary geometry can be formed on a substrate surface by sequentially overlapping the ends of adjacent conductive metal strips.

The geometry of the individual metal strips is determined by the need of the user to lay out a specific conductive path. The shape of the conductive metal strips used by the user is chosen such that it provides a balance between the need to provide the user with ease of handling while placing the conductive metal strips on the substrate surface and providing good alignment, registration, and electrical contact with the electrical contact pads on the various electronic components of the current invention that the conductive metal strips will be used to connect.

While copper tape is the most common commercially available metal tape other metal tapes are available and could be used in the current invention to form conductive traces however, they often tend to be more expensive than copper. In addition, some metal tapes such as those made from aluminum form oxides on their surface which interferes with their electrical conductivity and ability to make electrical contact. A non-conducting oxide layer on a metal surface would make that metal undesirable for use in the current invention.

Description of Electronic Component Module (ECM)

As described above the current invention encompasses a system of repositionable electronic component modules for use on a substrate to rapidly build, test, and reconfigure electronic circuits. Electronic circuits built with the current invention comprised three basic constituents, the substrate, conductive traces, and individual electronic components modules. Having discussed above the substrate and the conductive traces we now turn to describing the packaging of electronic components for use in the current invention. Electronic components which can be used in the current invention include both discrete electronic components as well as integrated circuits (ICs). We will first describe the packaging of the discrete electronic components in the current invention. Discrete electronic components include but are not limited to such electronic devices such as resistors, capacitors, diodes, switches, transistors, light emitting diodes (LEDs), solar cells, switches, relays, transformers, speakers, meters, lamps, batteries, etc. Many of these discrete electronic components are two-terminal devices in that they have two electrical contacts or terminals by which they are electrically connected into a circuit. Some examples of two-terminal devices include resistors, capacitors, diodes, and batteries. Other discrete electronic devices such as transistors have three terminals. Additionally, some discrete electronic devices have an orientation or polarity while others do not. Examples of discrete electronic devices with a polarity include batteries, diodes, and certain types of capacitors. The polarity of the device requires that the device be inserted into an electronic circuit in a particular orientation for the circuit to operate properly.

Figure 6:
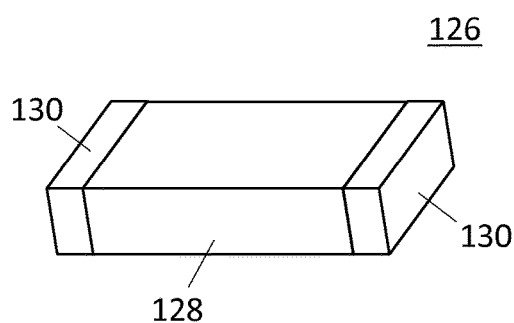
FIG. 6 is a perspective view of the surface mount packaging of a two terminal electronic component.

Electronic components are typically manufactured and packaged so that they can be used in a modern electronic circuit board fabrication process. Since the late 1980s the dominate form of electronic component packaging has been a packaging technology known as surface-mount technology (SMT). An electronic component produced in this manner is referred to either as a surface-mount device (SMD) or surface-mount component (SMC). Two-terminal surface-mount devices such as resistors and capacitors are shaped as small rectangular boxes the dimensions of which are standardized by the electronics industry. FIG. 6 is a perspective view from above which shows a typical two-terminal surface-mount device 126. The two terminal surface-mount device 126 comprises of the SMD body 128 and the surface-mount device's two electrical terminals 130 which encompass the two end caps of the SMD. One embodiment of the current invention uses surface-mount versions of electronic components mounted in electronic component modules (ECMs). The ECMs allow the electronic components housed in the ECMs to be used to build circuits in accordance with the current invention without the need to use solder or other mechanical attachments to secure them to the substrate and make electrical connections to the conductive traces on the substrate.

Figure 7A:
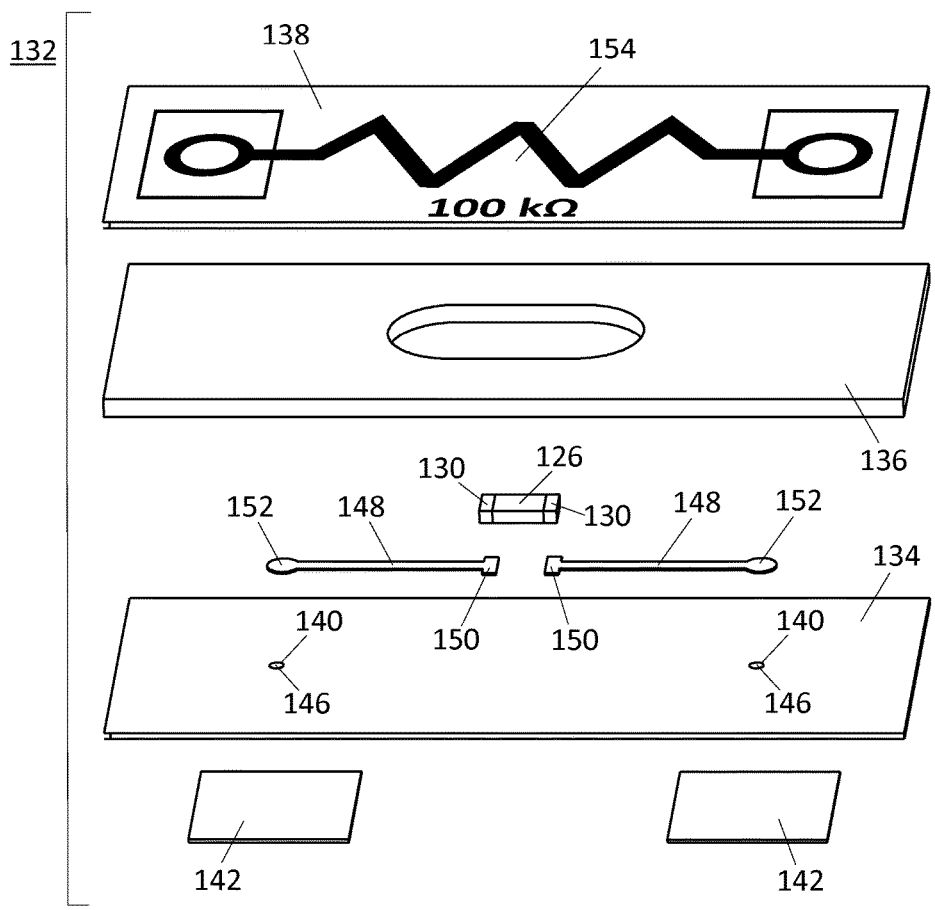
FIG. 7a is an exploded view of a two-terminal electronic component module incorporating the principles of the current invention.
Figure 7B:
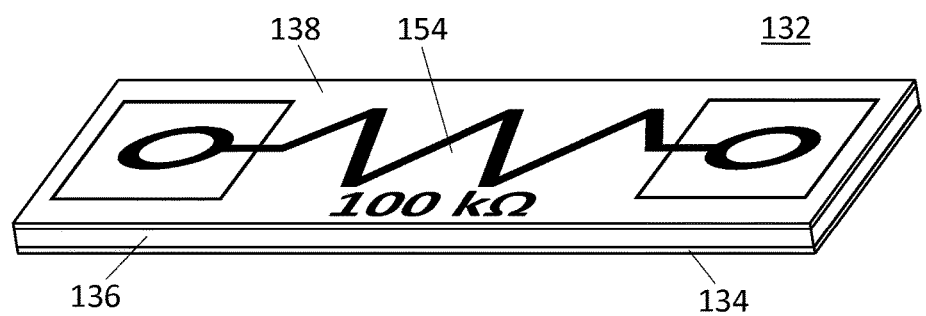
FIG. 7b is a perspective view from above of a two-terminal electronic component module.
Figure 7C:
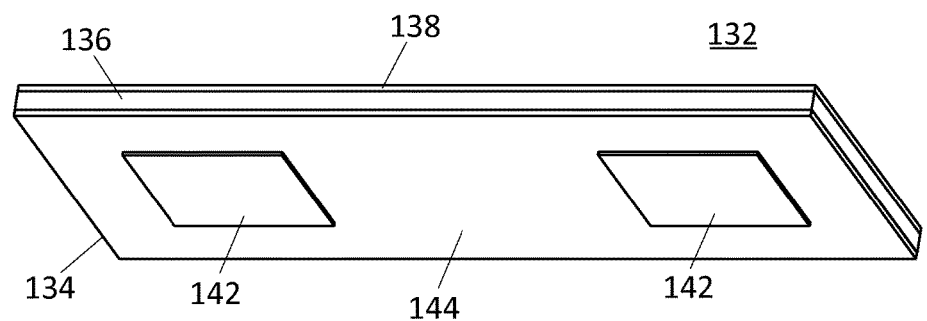
FIG. 7c is a perspective view from below of a two-terminal electronic component module.

FIG. 7a, FIG. 7b, and FIG. 7c show multiple views of one embodiment of a two-terminal electronic component module (ECM) 132 in the present invention. FIG. 7a is an exploded view of the two-terminal ECM 132. FIG. 7b is a perspective view from above of the two-terminal ECM 132 and FIG. 7c is a perspective view from below of the two-terminal ECM 132. The two-terminal ECM 132 comprises of a two-terminal surface-mount device (SMD) 126 packaged inside the ECM housing. The housing includes a base 134, a spacer 136, and a cover 138. The base 134 consists of a rectangular sheet of card stock of predetermined thickness into which two holes or vias 140 have been cut. The vias are positioned apart from one another along the long axis of the base 134 near either end of the base. Mounted on the underside of the base 134 over each via is an electrically conductive contact pad 142. The underside surface of the base 134 except where the contact pads 142 are located is coated with a repositionable adhesive 144. The vias 140 in the base 134 are filled with an electrically conductive material 146. Mounted on the top surface of the base 134 are two electrical conduction leads 148. Each conduction lead has a solder pad 150 at one end and a via contact pad 152 at the other. The terminals of the two-terminal SMD 126 are electrically and mechanically attached to the conduction leads 148 using either solder or a conductive adhesive and are attached to the conduction leads at the conduction lead solder pads 150. The conduction leads 148 are electrically connected to the electrically conductive material 146 in the vias 140 through the via contact pads 152 of the conduction leads. The spacer 136, which has the same planer dimensions as the base is composed of a rectangular sheet of card stock into which a hole or slot is cut and serves as a stand-off and support structure as part of the ECM. The thickness of the spacer 136 is predetermined to be minimally equivalent to the height of the SMD 126 mounted on the base 134. The spacer is required to be thick enough to provide sufficient clearance for the cover 138 to be mounted onto the spacer without physical interference from the SMD 126. To provide the proper amount of height the use of one or more individual spacers may be required. If more than one spacer is required the individual spacers are stacked on top of one another until the required height is achieved. The spacer is permanently attached to the base through the use of either an adhesive or glue. If multiple spacers are used then the individual spacers are permanently bonded together. The spacer 136 supports the cover 138 which is permanently attached to the spacer 136 through the use of an adhesive or glue. The cover 138 which has the same planer dimensions as the base and a predetermined thickness is composed of a rectangular sheet of card stock. The cover 138 serves two purposes in the current invention, first, the cover provides a protective barrier for the SMD 126 and the conduction leads 148 and second, the cover 138 is used as a substrate for affixing identifying information to the ECM. The identifying information encoded in the identification marking 154 is used to identify the critical attributes of the electronic component mounted in the ECM. The identification marking 154 can include graphic elements, numbers, and or symbols.

We will now discuss in detail various features of the two-terminal electronic component module (ECM) 132 in accordance with the current invention starting with the electrical conduction leads 148. As described above the electrical conduction leads 148 are mounted on the top surface of the base 134. The electrical conduction leads 148 can be implemented in a variety of ways in accordance with the current invention. In one embodiment of the current invention the electrical conduction leads 148 can be formed from conductive metal tape which is then affixed to the top surface of the base 134. In another embodiment of the current invention the electrical conduction leads 148 are formed from electrically conductive ink printed on the top surface of the base 134. In a similar manner the contact pads 142 can be formed from conductive tape which is affixed to the bottom surface of the base 134 covering the vias 140. In another embodiment of the current invention the electrical contact pads can also be formed by printing an electrically conductive ink on to the bottom surface of the base 134. The contact pads 142 shown in FIGS. 7*b* and 7*c* are shown to be thin sheets square or rectangular in shape. The purpose of the contact pad is to make electrical contact with a conductive trace on a substrate. Therefore, in accordance with the current invention the contact pad can be any planer geometry which facilitate its alignment and contact with a conductive trace.

Embodiments for Electrical Connection of Conduction Lead to Contact Pad in ECM

Figure 8A:
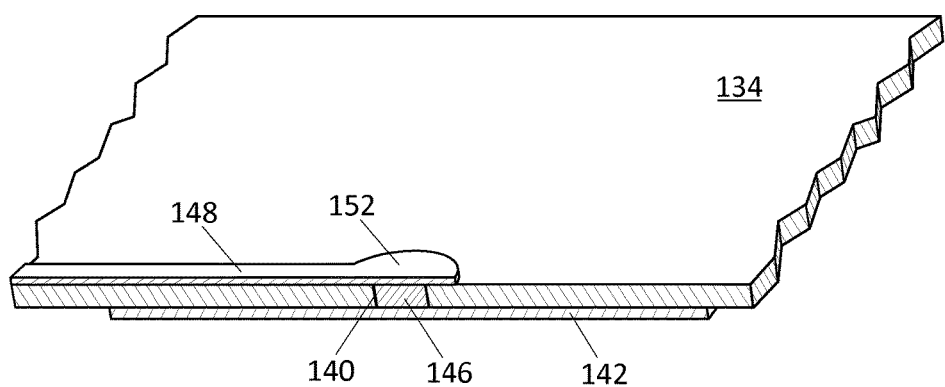
FIG. 8a is a perspective sectional partial view of a via in the electronic component module base filled with an electrically conductive material.

The conduction leads 148 on the top surface of the base 134 are electrically connected to the contact pads 142 on the underside of the base through vias 140 cut into the base. An electrical connection through the vias 140 in accordance with the current invention can be achieved through the filling of the vias with an electrically conductive material 146 as illustrated in FIG. 8*a*. FIG. 8*a* is a sectional partial view from above of a via 140 in a base 134 with the conduction lead 148 mounted on the upper surface of the base and the contact pad 142 mounted on the bottom of the base. One technique of filling of the via with an electrically conductive material in accordance with the current invention is to place an electrically conductive metal plug into the via and conductively bond both the electrical conduction lead 148 and the contact pad 142 to either side of the conductive metal plug. The conductive bond between the metal plug, conduction lead 148, and the contact pad 142 can be achieved through the use of but is not limited to a conductive adhesive, conductive epoxy, or solder. Another embodiment of the electrically conductive material 146 in accordance with the current invention is conductive epoxy. In yet another embodiment of the current invention the electrically conductive material 146 is solder. In yet another embodiment of the current invention the electrically conductive material 146 is conductive ink.

Figure 8B:
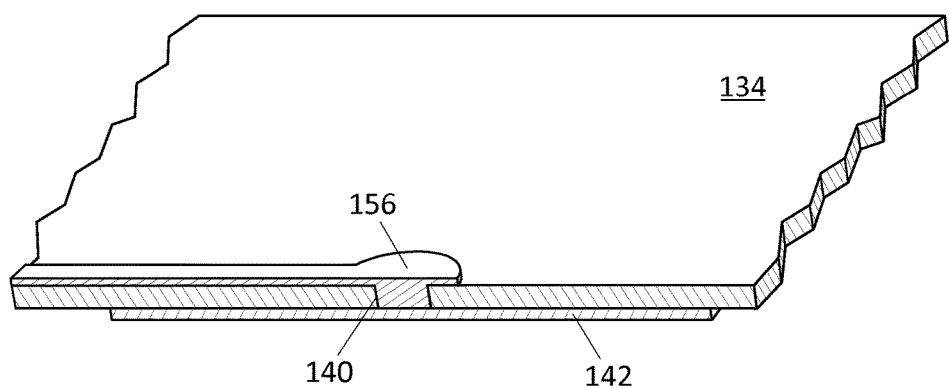
FIG. 8b is a perspective sectional partial view of a via in the electronic component module base filled with electrically conductive ink from the printing of the contact lead.

Another embodiment in accordance with the current invention is to form the contact pads with conductive metal tape and use electrically conductive ink printed directly onto the top side of the base to form the electrical conduction leads. This embodiment is shown in FIG. 8*b*. FIG. 8*b* is a sectional partial view from above of a via 140 in a base 134 wherein the conductive ink from the printing of the conduction lead 156 is allowed to flow into and fill the via 140 making a direct electrical connection to the contact pad 142.

Figure 8C:
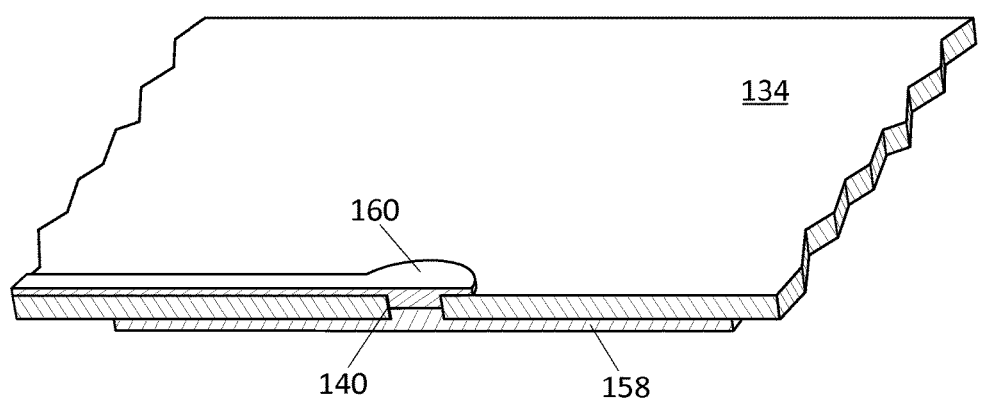
FIG. 8c is a perspective sectional partial view of a via in the electronic component module base filled with electrically conductive ink from printing both the contact lead and contact pad.

In another embodiment the conductive ink from printing both the conduction lead and the contact pad is allowed to flow into and jointly fill the via. This embodiment is shown in FIG. 8*c*. FIG. 8*c* is a sectional partial view from above of a via 140 in a base 134 wherein both the contact pad 158 and the conduction lead 160 are formed through printing conductive ink directly onto the base. The conductive ink from printing both the conduction lead 160 and the contact pad 158 is allowed to flow into and jointly fill the via 140 making a direct electrical connection between the conduction lead and the contact pad.

Figure 8D:
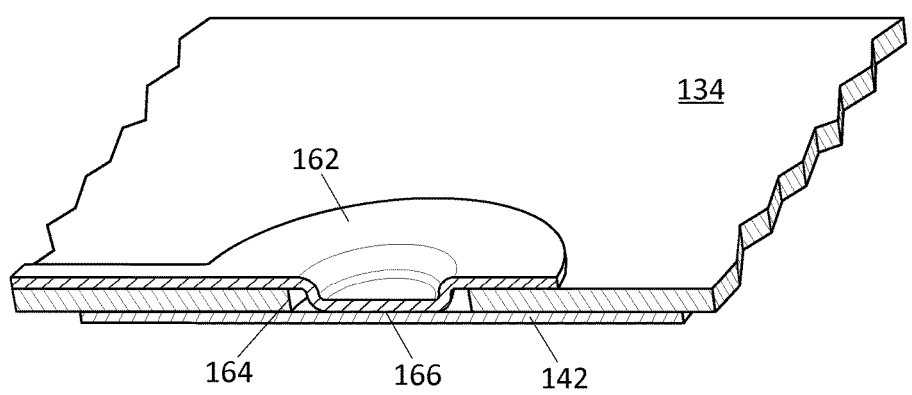
FIG. 8d is a perspective sectional partial view of a via in the electronic component module base wherein the conduction lead is deformed into the via to make electrical contact with contact pad.

In yet another embodiment both the conduction lead and the contact pad are formed from conductive metal tape and connected directly to one another in the via. This embodiment is shown in FIG. 8*d*. FIG. 8*d* is a sectional partial view from above of a via 164 in a base 134 wherein both the contact pad 142 and the conduction lead 162 is formed from conductive metal tape. In this embodiment the via 164 is made large enough that the end of the conduction lead 162 can be deformed into the via and make physical and electrical contact 166 with the contact pad 142 on the underside of the base 134. Electrical contact can be enhanced between the conduction lead 162 and the contact pad 142 through the use of a conductive adhesive at their point of contact.

Figure 8E:
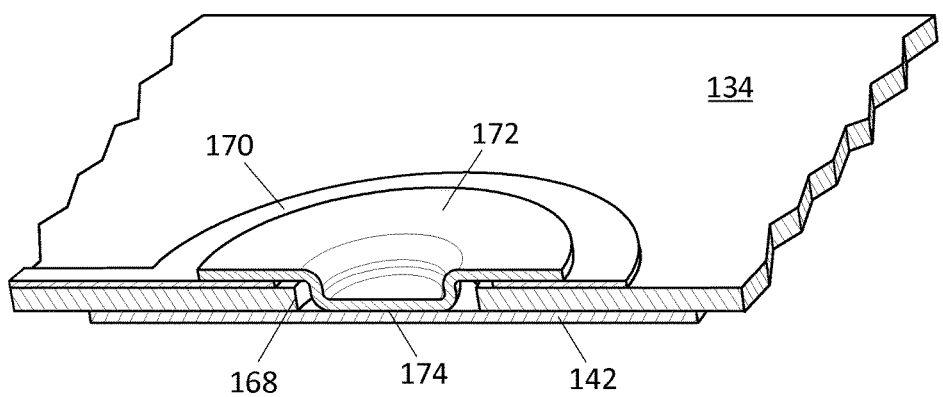
FIG. 8e is a perspective sectional partial view of a via in the electronic component module base wherein a conductive tape cap electrically connects the conduction lead to the contact pad through via.

In yet another embodiment the conduction lead is printed with conductive ink, the contact pad is formed from conductive tape and the conduction lead and contact pad are electrically connected through the use of a conductive tape cap deformed into the via. This embodiment is shown in FIG. 8*e*. FIG. 8*e* is a sectional partial view from above of a via 168 in a base 134 in which the conduction lead 170 is printed on the top surface of the base 134 using conductive ink and the contact pads 142 are formed using conductive metal tape. In this embodiment the conduction lead 170 is printed around the via but not over or in the via. The electrical connection between the conduction lead 170 and the contact pad 142 is enabled through the addition of a disk shaped cap 172 made from conductive tape which is mounted on top of the conduction lead 170 over the via 168. The cap 172 makes an electrical connection to the conduction lead 170 and the contact pad 142 through the use of a conductive adhesive coated on its underside. The conductive tape cap 172 is mounted over the via 168 and then mechanically deformed into the bore of the via such that it makes mechanical and electrical contact 174 with the contact pad 142.

FIG. 8*a* through FIG. 8*e* show a variety of embodiments in accordance with the current invention which facilitate electrical conduction between the conduction lead and contact pad through the via in the base. Regardless of the specific technique used it should be apparent that the size and shape of the vias can be varied to improve electrical conductivity between the conduction leads and their respective contact pads. For example while the vias 140 shown in FIG. 7*a* are circular in cross-section they could also be square, rectangular, hexagonal, or any other possible planar geometry. Regardless of the geometry of the via the size of the individual vias can also be increased to increase the total cross-sectional area across which electrical conduction occurs. It should also be apparent that increasing the number of vias per contact pad conduction lead pair can also improve electrical conductivity between the conduction leads and their respective contact pads. Multiple vias can be laid out in any number of patterns or grid including but not limited to, linear, square, and hexagonal.

Use of Encapsulant to Protect Electronic Components in ECM

Figure 9A:
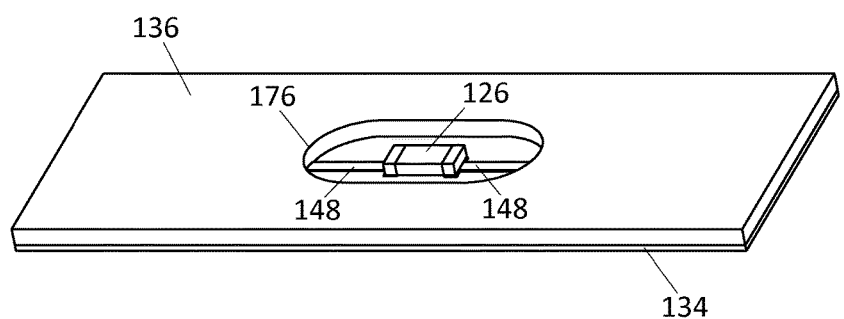
FIG. 9a is a perspective view from above of a two-terminal electronic component module with the cover removed revealing the cavity formed by the spacer mounted on the base.
Figure 9B:
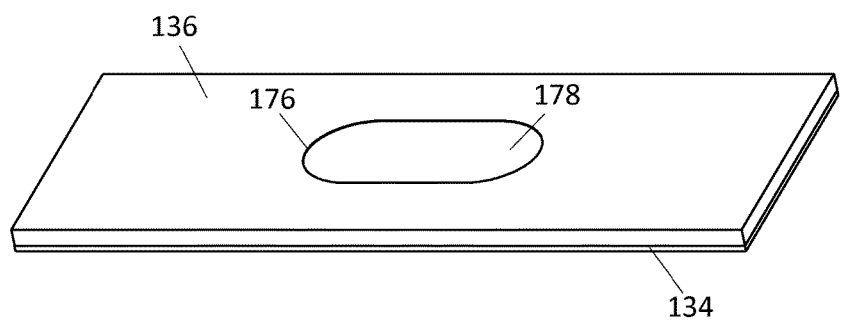
FIG. 9b is a perspective view from above of a two-terminal electronic component module with the cover removed and the cavity formed by the spacer mounted on the base filled with an encapsulant.

As described above the two-terminal ECM incorporates a spacer 136 to serve as a stand-off and support structure. To further support the cover 138, provide extra rigidity to the ECM, and protect the enclosed electronic component the cavity formed by the base and the inner walls of the spacer in the ECM can be filled with a potting compound or encapsulant. Potting compounds or encapsulants are typically used in the electronics industry to protect electronic components from shock, vibration, and for the exclusion of moisture and corrosive agents. FIG. 9*a* is a perspective view from above of one embodiment of the two-terminal electronic component module (ECM) in the present invention. The two-terminal ECM in FIG. 9*a* is shown without its cover for the purposes of clarity. In FIG. 9*a* the SMD 126 can be seen mounted on the conduction leads 148 in the cavity 176 formed by the attachment of the spacer 136 onto the base 134. FIG. 9*b* is a perspective view from above of another embodiment of the current invention wherein the same device as in FIG. 9*a* has its cavity 176 filled with an encapsulant 178. In accordance with the current invention potential encapsulant material may include non-conducting epoxy, resin, thermo-setting plastic, or silicone rubber.

Identification Markings on ECM

Figure 10A:
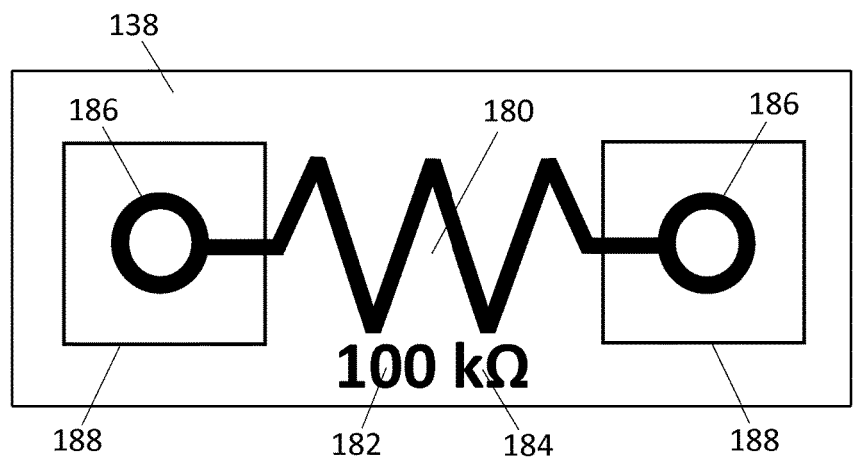
FIG. 10a is a top view of a two terminal electronic component module displaying typical graphical elements describing an enclosed resistor.
Figure 10B:
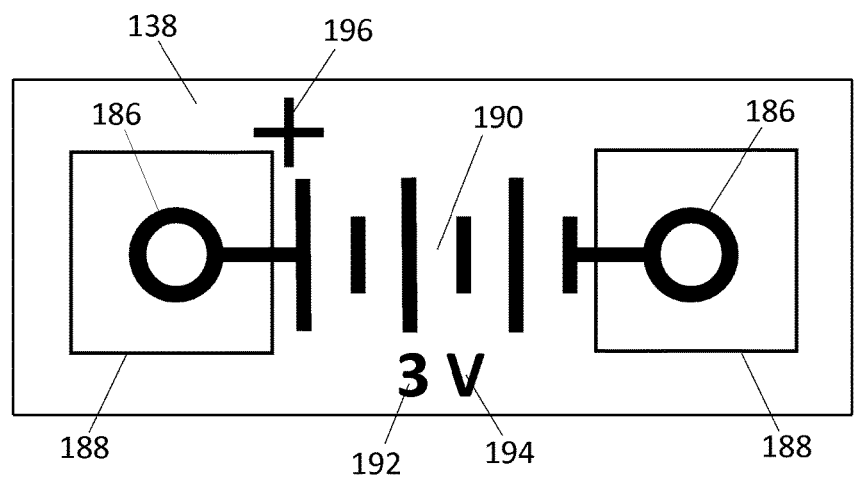
FIG. 10b is a top view of a two terminal electronic component module displaying typical graphical elements describing an enclosed battery.

As described above and shown in FIGS. 7a and 7b an identification marking 154 is provided on the cover of the two-terminal ECM. The identification markings are used to identify the type and properties of the electronic component mounted inside the ECM. FIGS. 10a and 10b show examples of an embodiment of identification markings in accordance with the current invention. FIG. 10a is a top view of a two-terminal ECM which shows identification markings for a two-terminal ECM containing a resistor while FIG. 10b is a top view of a two-terminal ECM which shows the identification markings for a two-terminal ECM containing a battery. The identification markings in accordance with the current invention can include pictograms, graphic elements, numbers, letters, and or symbols. While it is possible to use proprietary pictographs to indicate various electronic components it is better to incorporate standard symbols for electronic components such as those described in ANSI standard Y32 and IEEE Std. 315. For example the identification markings shown in FIG. 10a includes a graphic symbol 180 for a resistor, a numerical value 182 corresponding to the measure of resistance for the device, and a symbol 184 to indicate the relevant units of measure. Taken together the identification markings in FIG. 10a indicates that the SMD in that particular ECM is a 100 kilohm resistor. The closed circles 186 circumscribed by squares 188 terminating either end of the graphic symbol indicates the location of the contact pads on the underside of the ECM which are connected to the leads of the enclosed resistor.

FIG. 10b includes a graphic symbol for a battery 190, a numerical value 192 of "3" corresponding to the measure of voltage across the battery, and the symbol 194 "V" indicating the relevant units associated with the numerical value 192. Taken together the identification markings in FIG. 10b indicates that the electronic component in that particular ECM is a 3 volt battery. As in FIG. 10a the closed circles 186 circumscribed by squares 188 indicates the location of the contact pads on the underside of the ECM which connect to the leads of the enclosed battery. There is an additional symbol 196 in FIG. 10b, a "+" or plus sign which indicates the polarity of the device. In FIG. 10b the inclusion of the "+" or plus sign symbol 196 indicates that the contact pad closest to the symbol is the positive terminal.

In one embodiment of the current invention the identification markings 154 are printed on the top surface of the cover 138. In another embodiment of the current invention the identification markings 154 are embossed into the top surface of the cover 138. In yet another embodiment the identification markings 154 are engraved into the top surface of the cover 138. In yet another embodiment the identification markings 154 are molded into the cover 138. In the embodiments of the current invention wherein the identification marking 154 is embossed, engraved, or molded into the cover the identification marking can also be colored, stained, and or coated with ink to improve visibility of the identification marking.

In the above described embodiment of the two-terminal ECM 132 the base 134, spacer 136, and cover 138 are indicated as being fabricated from card stock. The base 134, spacer 136, and cover 138 can alternatively be fabricated from any semi-rigid or rigid non-conducting material such as paper, plastic, or ceramic.

Mounting of ECM onto Substrate

Figure 11A:
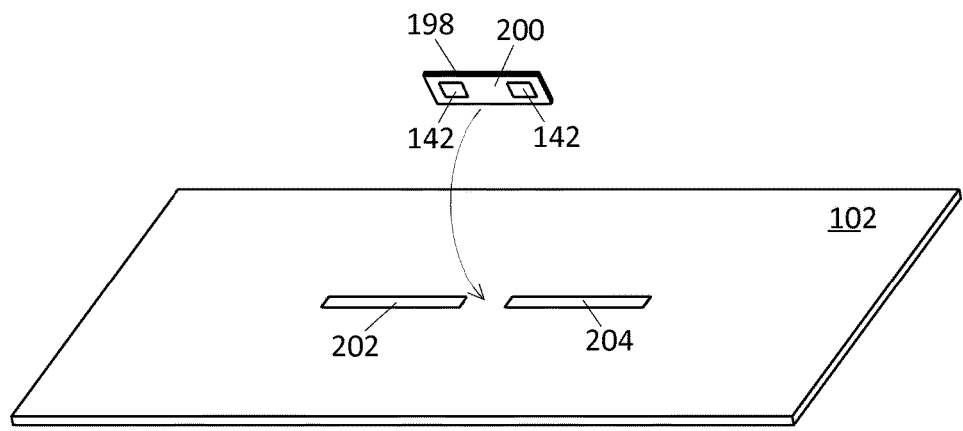
FIG. 11a is a perspective view from above of the mounting of a two-terminal electronic component module on a substrate in electrical contact with conductive traces.
Figure 11B:
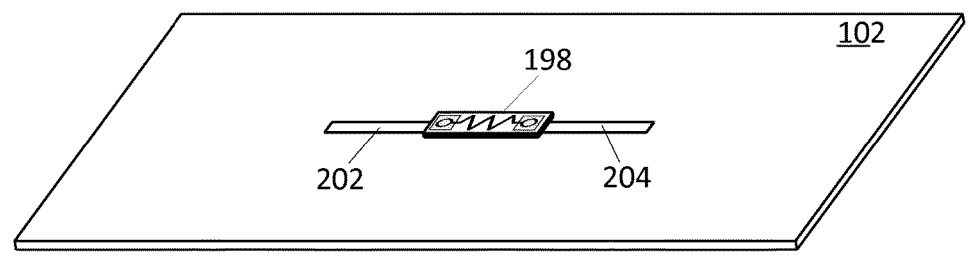
FIG. 11b is a perspective view from above of a two-terminal electronic component module mounted on a substrate in electrical contact with conductive traces.

As described above the ECM is used in the current invention to hold and affix an electronic component to the substrate while simultaneously allowing the electronic component in the ECM to make an electrical connection with conductive traces external to the ECM mounted on the substrate. For the ECM to adhere to a substrate the base of the ECM is coated with a repositionable adhesive that allows the ECM to adhere to the substrate while holding the contact pads of the ECM in electrical contact with conductive traces on the substrate. FIGS. 11a and 11b show the mounting of a two terminal ECM onto a substrate surface. FIG. 11a is a perspective view from above of a two-terminal ECM in the process of being mounted onto a substrate. FIG. 11b is a perspective view from above of a two-terminal ECM mounted on a substrate in electrical contact with conductive traces. As previously described the bottom surface of the base of the ECM 200 is coated with a repositionable adhesive which is used to attach the ECM to a substrate surface 102 and hold the ECM's contact pads 142 in electrical contact with the conductive traces 202, 204 already positioned on a substrate. In affixing the two-terminal ECM 198 to the substrate the two-terminal ECM is aligned with the conductive traces 202, 204 on the substrate so that the contact pads 142 of the two terminal ECM make independent electrical contact with the separate conductive traces 202, 204. In the current invention the repositionable adhesive coated on the underside of the base of the ECM is not applied to the contact pads on the underside of the ECM base because the adhesive would interfere with the electrical conductivity between the conductive traces 202, 204 on the substrate and the contact pads 142. The use of a repositionable adhesive in the current invention allows individual ECMs to be removed from the substrate and placed at a different point on the substrate, or reused at a later time on the same or different substrate.

Description of LED ECM

As described above there are a variety of discrete electronic components of which many are two-terminal devices. The two-terminal ECM of the current invention described above works well with SMD versions of resistors, capacitors, and certain types of diodes. However, the SMD versions of other electronic components require modified versions of the current invention as already described to accommodate their unique characteristics. One example is the light emitting diode (LED). An LED is a diode which when electric current is passed through the device in a particular direction the LED emits light. Typically a lens is mounted on the LED to orient and focus the light generated by the LED. The current invention as described above and shown in FIGS. 7a, 7b, and 7c does not have a way for the light generated by a SMD LED mounted in the ECM to exit the ECM. Since it is desirable for a user of the current invention to see the light generated by the SMD LED the two-terminal ECM of the current invention is modified to incorporate a SMD LED.

Figure 12A:
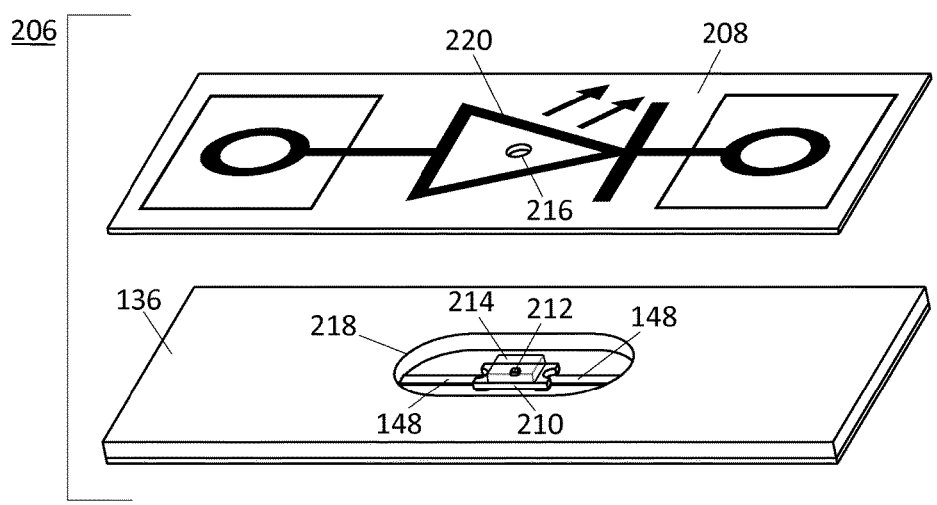
FIG. 12a is an exploded view of an LED electronic component module.
Figure 12B:
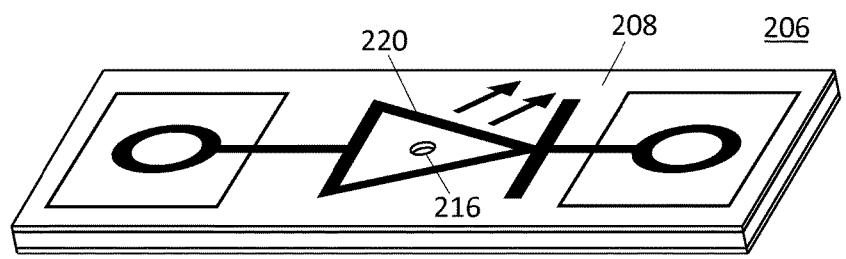
FIG. 12b is a perspective view from above of a fully assembled LED electronic component module.

FIG. 12a and FIG. 12b shows an embodiment of the two-terminal ECM which can accommodate a SMD LED. FIG. 12a shows an exploded view of a modified two-terminal ECM, the LED ECM 206 with the cover 208 removed while FIG. 12b is a perspective view from above which shows the LED ECM 206 fully assembled. As shown in FIG. 12a the SMD LED 210 is mounted in the ECM as any other SMD with its terminals bonded to the conduction leads 148. The SMD LED has two prominent features, the first is the LED die 212 and the second is the LED lens 214. The LED die 212 generates light as electric current is passed through the die. The light generated by the LED die 212 is then focused and directed by the LED lens 214. To allow the light from the SMD LED 210 to exit the ECM the ECM incorporates a hole or viewing port 216 in the cover 208 of the ECM. To maximize the light exiting the ECM, the viewing port 216 is positioned over the LED lens 214. In one embodiment of the current invention the viewing port 216 can be an open hole. In another embodiment of the current invention the viewing port can be covered with a transparent material such as clear tape or plastic. In yet another embodiment the viewing port can be filled with a transparent material such as acrylic or clear silicone rubber. As described previously the cavity 218 of the ECM can be filled with an encapsulant however with the SMD LED 210 care needs to be taken so as not to cover the top of the LED lens 214 with the encapsulant. The exception to this is if the encapsulant itself is transparent as in the case of a clear silicone rubber encapsulant.

As with other ECMs the cover 208 incorporates identification markings 220 which identify the electronic component mounted in the ECM. For the LED ECM the identification markings 220 on the cover 208 can be integrated with the viewing port 216. The identification markings 220 in FIG. 12a and FIG. 12b shows a typical pictogram for a LED. The viewing port 216 is positioned in the center of the pictogram. An LED is a type of diode. As described above diodes have a polarity which requires that the diode be inserted into an electronic circuit in a particular orientation for the circuit and component to operate properly. The polarity of the LED is revealed in the LED pictogram of the identification markings 220 which is asymmetric. Therefore inherent in the identification markings 220 is the polarity and orientation of the LED itself.

Description of Battery ECM

Figure 13A:
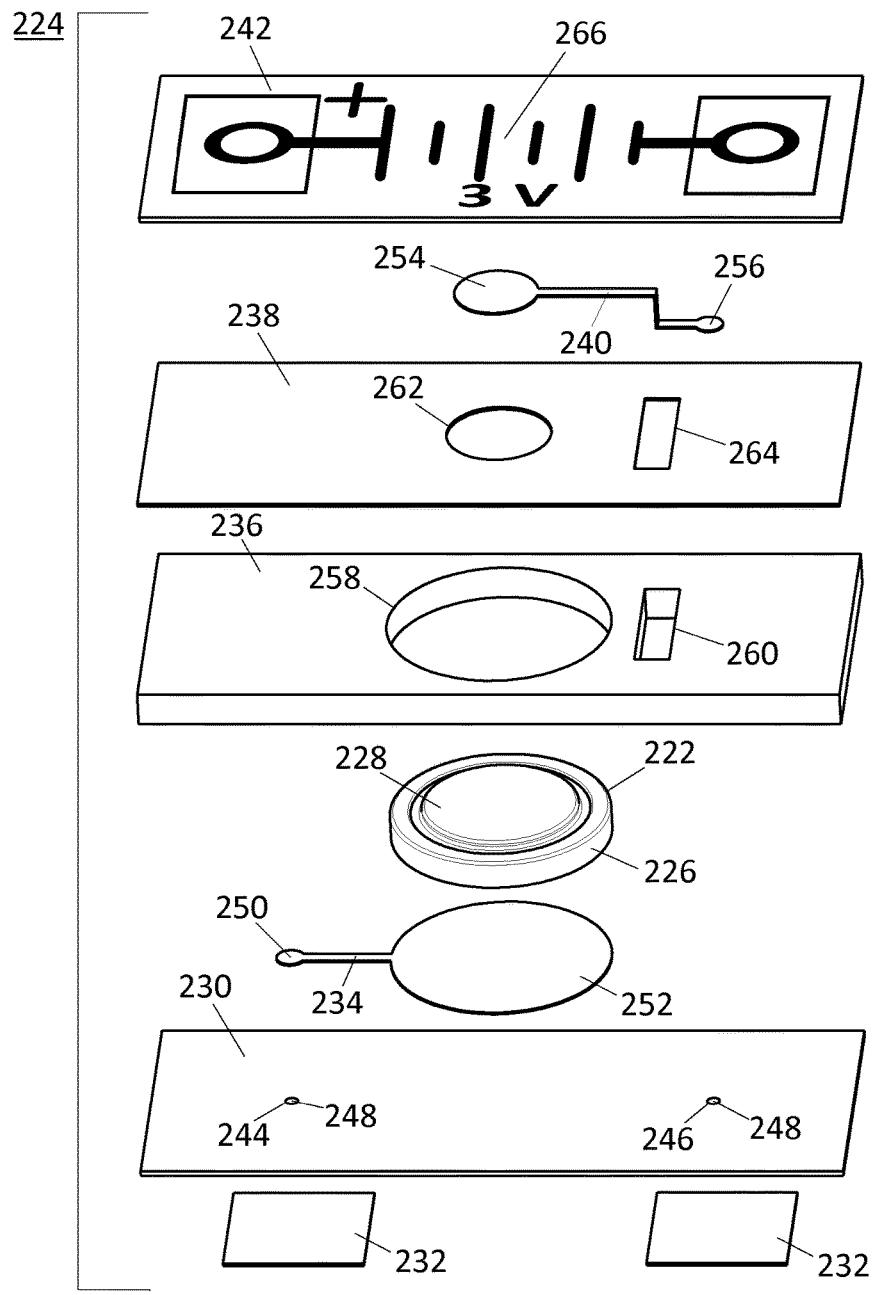
FIG. 13a is an exploded view of exploded view of a battery electronic component module.

Another embodiment of the current invention is an ECM modified to hold a battery. A battery is a two-terminal device which possesses a polarity. While batteries come in all shapes and sizes two types of batteries which are well suited for incorporation into the current invention are coin cells and printed batteries. Coin cell batteries are generally the size and shape of coins thus their name. FIG. 13a is an exploded view which shows a typical coin cell battery 222 incorporated into a modified ECM of the current invention, the battery ECM 224. A coin cell battery 222 has two terminals, a positive terminal 226 and a negative terminal 228. As the coin cell battery is predominantly shaped as a flat wide cylinder the positive terminal 226 encompasses the base and side walls of the cylinder while the negative terminal 228 consists mostly of the top or cap of the cylinder. In this embodiment of the current invention the two-terminal ECM is modified to accommodate the terminals and overall geometry of the coin cell battery.

Figure 13B:
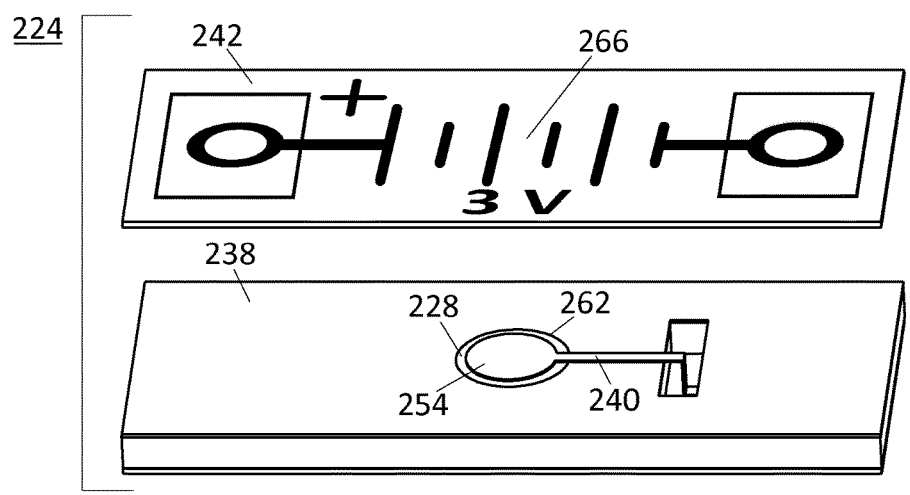
FIG. 13b is a partially assembled exploded view of a battery electronic component module showing the attachment of the negative terminal conduction lead to the negative terminal of the battery.
Figure 13C:
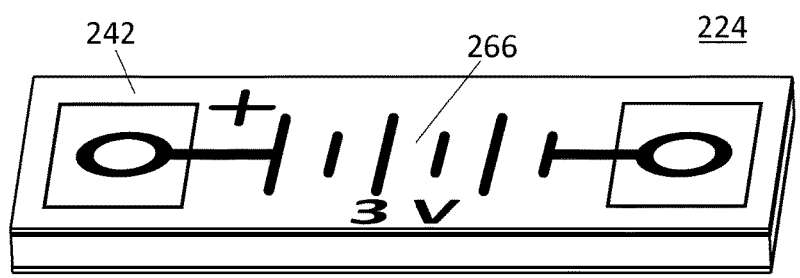
FIG. 13c is a perspective view from above of a fully assembled battery electronic component module.

The battery ECM 224 shown in the FIGS. 13a, 13b, and 13c includes a base 230, two contact pads 232, a positive terminal conduction lead 234, the coin cell battery 222, a battery spacer 236, a contact isolation cover 238, a negative terminal conduction lead 240, and a cover 242. As with the previously described ECMs the battery ECM base 230 is formed from a rectangular sheet of card stock into which a pair of vias 244, 246 have been cut. The vias are positioned apart from one another along the long axis of the base 230 near either end of the base. As with the previously described ECMs the contact pads 232 are mounted on the underside of the base 230 over the vias 244, 246 cut into the base. As with the previously described ECMs in one embodiment the contact pads 232 are formed from conductive metal tape while in another embodiment the contact 232 pads are formed by printing conductive ink on the underside of the base 230. Also, as with the previously described ECMs of the current invention the underside surface of the base 230 except where the contact pads are located is coated with a repositionable adhesive. As with the previously described ECMs the vias 244, 246 of the base are filled with an electrically conductive material 248 such as solder or an electrically conductive ink. The positive terminal conduction lead 234 is a conductive trace with a via contact pad 250 on one end and a battery contact pad 252 on the other. The positive terminal conduction lead 234 is affixed to the top of the base 230 such that the via contact pad 250 of the positive terminal conduction lead 234 is centered over the left side via 244 and the battery contact pad 252 is centered on the base 230 as shown in FIG. 13a. In one embodiment of the current invention the positive terminal conduction lead 234 is made from conductive metal tape affixed to the top surface of the base. In another embodiment the positive terminal conduction lead 234 is formed from conductive ink printed on the top surface of the base. The battery contact pad 252 of the positive terminal conduction lead 234 is designed to make electrical contact with the positive terminal of the coin cell battery 222. The coin cell battery 222 is mounted on the battery contact pad 252 with the positive terminal of the battery in contact with the battery contact pad. The negative terminal conduction lead 240 is a conductive lead with a terminal conduction pad 254 at one end and a via contact pad 256 at the other. The via contact pad 256 of the negative terminal conduction lead 240 is mounted on the base 230 over the right side via 246 as shown in FIG. 13a. The negative terminal conduction lead 240 is made from conductive metal tape. The via contact pad 256 of the negative terminal conduction lead 240 is electrically connected to the electrically conductive material 248 in the via 246 through the use of an electrically conductive adhesive.

The battery spacer 236 is made from a rectangular sheet of card stock with the same planer dimensions as the base. The battery spacer 236 is permanently attached to the top surface of the base 230 using glue or epoxy. There are two through holes cut into the battery spacer 236, the battery channel 258 and the spacer contact lead channel 260. The battery channel 258 is centered in the battery spacer and has a diameter which is slightly larger than the diameter of the coin cell battery 222. The purpose of the battery channel 258 is to hold the battery in position over the battery contact pad 252.

The spacer contact lead channel 260 in the battery spacer 236 is offset from the battery channel 258 in the proximity of the via 246 connected with the negative terminal conduction lead 240. The spacer contact lead channel 260 allows the negative terminal conduction lead 240 to be threaded up and through the battery spacer 236. Consequently, the spacer contact lead channel's cross-sectional geometry must be of a sufficient size and geometry to allow the negative terminal conduction lead 240 to be threaded up and through the battery spacer 236. The spacer contact lead channel's 260 cross-sectional geometry may be rectangular, circular or any other geometry which facilitates the threading of the negative terminal conduction lead 240 through the battery spacer 236. The thickness of the battery spacer 236 is predetermined to provide sufficient clearance for the contact isolation cover 238 and cover 242 to be mounted onto the spacer without physical interference from the coin cell battery 222. The contact isolation cover 238 is made from a rectangular sheet of paper with the same outer planer dimensions as the base. The contact isolation cover 238 is permanently affixed using glue or epoxy to the top of the battery spacer 236 and over the coin cell battery 222. The contact isolation cover 238 has a hole or access port 262 which is positioned over the negative terminal 228 of the coin cell battery 222. The access port 262 is smaller than the negative terminal 228 of the coin cell battery 222 so as to shield the positive terminal 226 of the coin cell battery 222 and prevent inadvertent contact between the negative terminal conduction lead 240 and the positive terminal 226 of the coin cell battery 222. The contact isolation cover 238 has a second through hole, the contact lead channel 264 which is centered over and of the same cross-sectional geometry of the spacer contact lead channel 260 in the battery spacer 236. The negative terminal conduction lead 240 is threaded through the spacer contact lead channel 260 in the battery spacer 236, and the contact lead channel 264 in the contact isolation cover 238. The terminal conduction pad 254 of the negative terminal conduction lead 240 is electrically connected using an electrically conductive adhesive to the negative terminal 228 of the coin cell battery through the access port of the contact isolation cover 238. A partially assembled battery ECM 224 can be seen in FIG. 13b. FIG. 13b is a perspective view from above of the battery ECM 224 with the cover 242 removed to show the terminal conduction pad 254 of the negative terminal conduction lead 240 attached to the negative terminal 228 of the coin cell battery.

FIG. 13c is a perspective view from above of the fully assembled battery ECM 224. The cover 242 which is made from a rectangular sheet of card stock of a predetermined thickness with the same planer dimensions as the base is permanently attached to the contact isolation cover 238 using an adhesive. The cover 242 protects the battery and its contact leads from the environment. The identification markings 266 on the cover 238 identify the battery type inside the battery ECM and its polarity as discussed previously.

In the embodiment described above several of the components of the battery ECM 224 are described as being fabricated from card stock such as the base 230, the battery spacer 236, and the cover 242 while the contact isolation cover 238 is described as being made from paper. The key requirement for these components are that they are electrically non-conductive. Therefore, in another embodiment the components could be fabricated from plastic and in yet another embodiment the components could be fabricated from ceramic.

Description of Printed Battery ECM

Figure 14A:
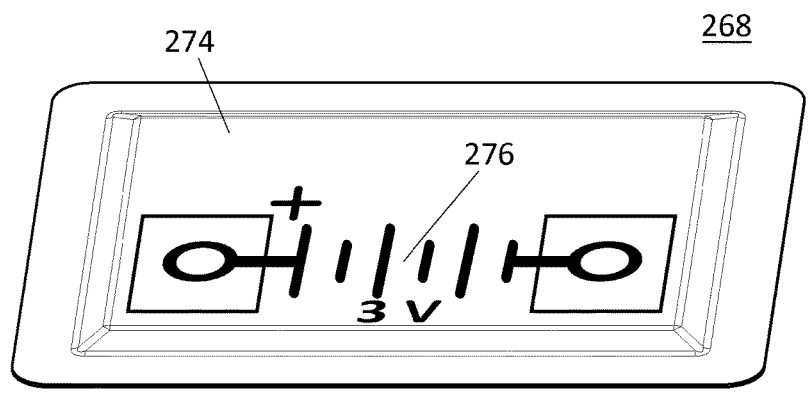
FIG. 14a is a perspective view from above of a printed battery adapted for use in the current invention.
Figure 14B:
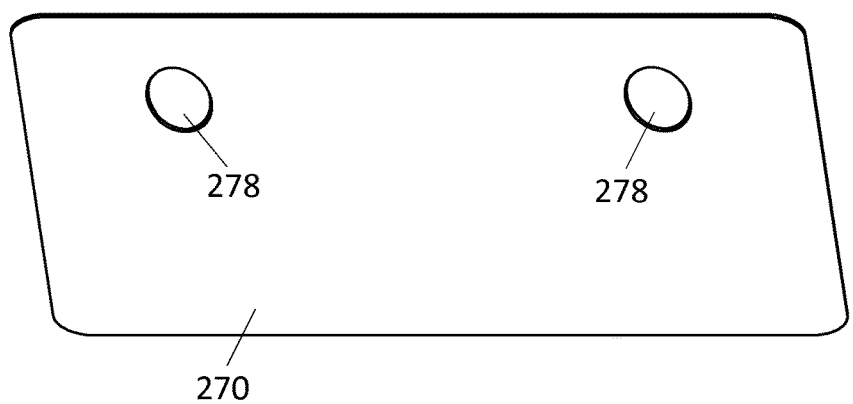
FIG. 14b is a perspective view from below of a printed battery adapted for use in the current invention with the contact pads removed revealing the printed battery's battery terminals.
Figure 14C:
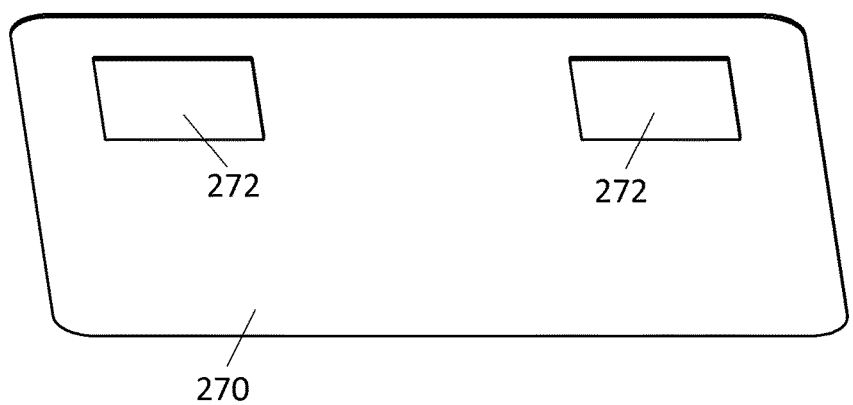
FIG. 14c is a perspective view from below of a printed battery with contact pads mounted over the printed battery's battery terminals.

As stated previously coin cells and printed batteries are particularly well suited for incorporation into the current invention. Printed batteries are a unique type of recently commercially available battery produced in a roll-to-roll screen printing manufacturing process. This process allows for the production of very thin and flexible batteries to be produced in a variety of sizes. In general a typical printed battery is of the size and shape of a single-use moist towelette pouch. The external casing of a printed battery is typically a polymer laminate pouch with external battery terminals. FIG. 14a, FIG. 14b, and FIG. 14c show a printed battery 268 incorporated into the current invention. FIG. 14a is a perspective view from above of a printed battery 268 incorporated into the current invention. FIG. 14b is a perspective view from below of a printed battery 268. FIG. 14c is a perspective view from below of a fully assembled printed battery 268 incorporated into the current invention.

In one embodiment of the current invention the bottom surface 270 of the printed battery 268 is coated with a repositionable adhesive and contact pads 272 are permanently affixed to the battery terminals 278 of the printed battery using a conductive adhesive. On the top surface 274 of the printed battery 268 an identification marking 276 is printed as previously described to identify the device as a battery and identify the polarity of the battery.

One important difference between the printed battery 268 and the battery ECM 224 is shape. Printed batteries are typically more square than rectangular as with the various ECMs of the current invention. Therefore, the use of the identification marking 276 on the printed battery 268 is more critical to guide the user in aligning the contact pads 272 of the printed battery 268 with the conductive traces on a substrate when affixing the printed battery to a substrate.

Description of Switch ECM

To build useful electronic circuits with the current invention requires another electronic component known as a switch. A switch is a two-terminal electronic device which prevents current from flowing through a circuit when the switch is open and allowing current to flow through the circuit when the switch is closed. Switches are produced in a variety of configurations however the simplest switch configuration is a what is known as a SPST or single pole single throw switch. In a SPST switch the poles or terminals of the switch are either electrically connected together or disconnected from each other. An example of this type of switch is an ordinary light switch.

Figure 15A:
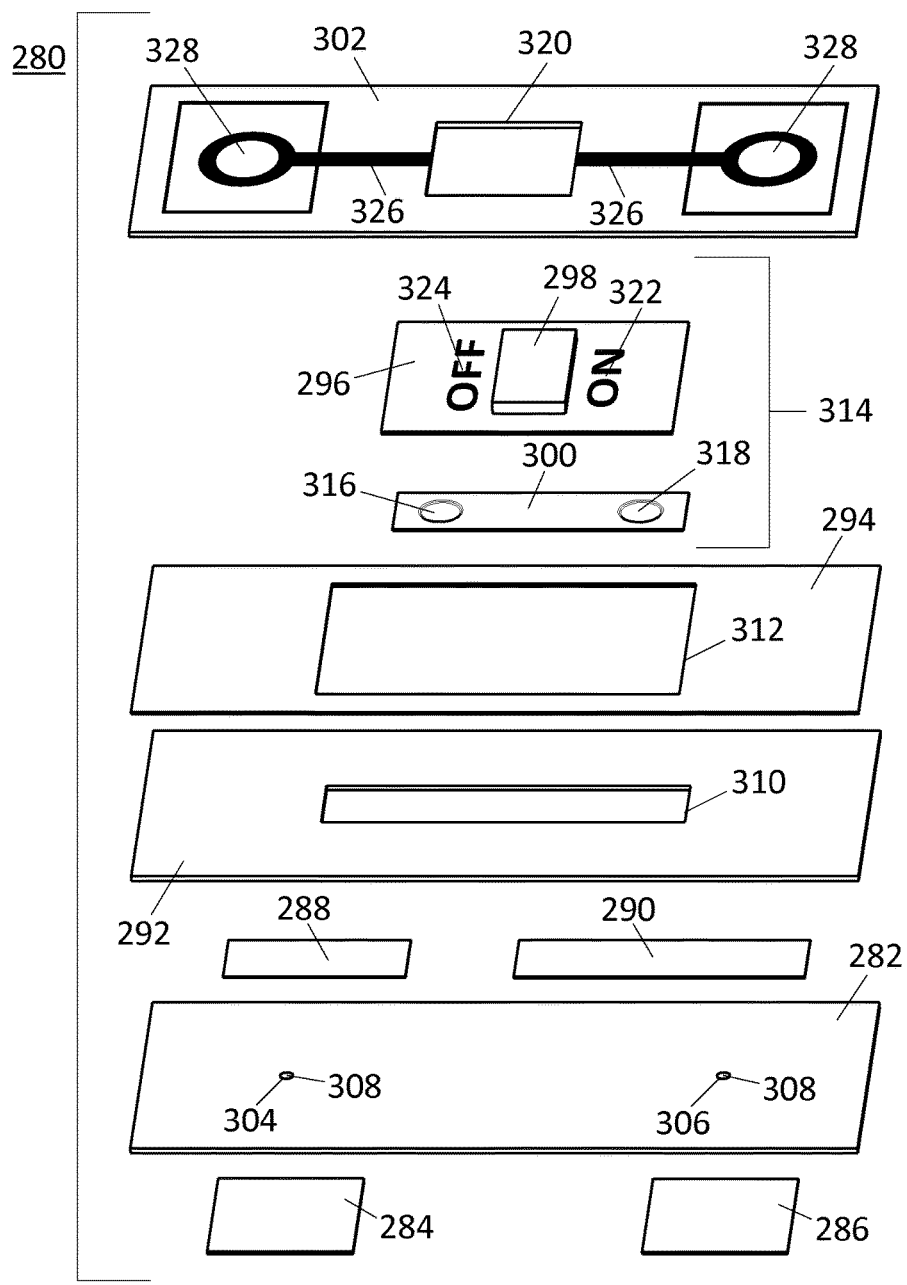
FIG. 15a is an exploded view of single pole single throw switch electronic component module.
Figure 15B:
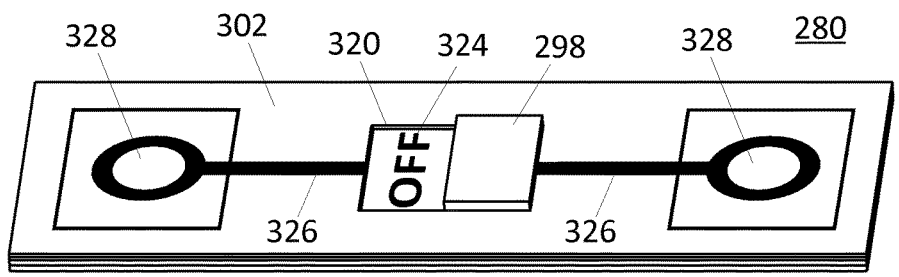
FIG. 15b is a perspective view from above of a switch electronic component module in the OFF position.
Figure 15C:
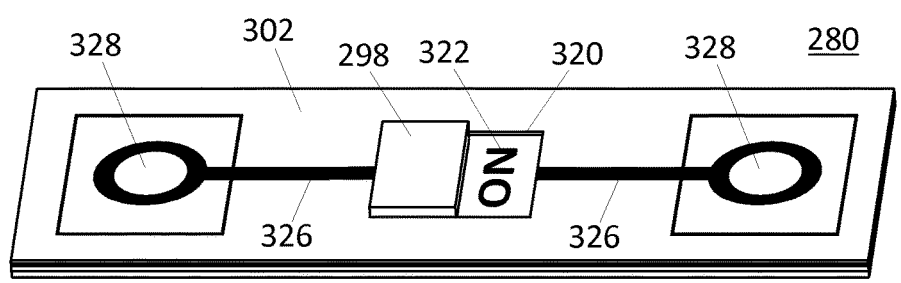
FIG. 15c is a perspective view from above of a switch electronic component module in the ON position.

FIG. 15a, FIG. 15b, and FIG. 15c show an embodiment of a SPST switch in accordance with the current invention. FIG. 15a is an exploded perspective view of the SPST switch ECM 280. The SPST switch ECM 280 comprises of a base 282, two contact pads 284, 286, an open-side fixed contact pad 288, a signal-side fixed contact pad 290, a sliding contact spacer 292, a actuator spacer 294, a actuator base 296, an actuator tab 298, a sliding contact 300, and a switch cover 302.

As with previously described ECMs of the current invention the SPST switch ECM base 282 is formed from a rectangular sheet of card stock of predetermined thickness into which a pair of vias 304, 306 have been cut. The vias are positioned apart from one another along the long axis of the base 282 near either end of the base. As with the previously described ECMs the contact pads 284, 286 are mounted on the underside of the base 282 over the vias 304, 306 cut into the base. As with the previously described ECMs in one embodiment the contact pads 284, 286 are formed from conductive metal tape while in another embodiment the contact pads are formed by printing conductive ink on the underside of the base 282. Also, as with the previously described ECMs of the current invention the underside surface of the base 282 except where the contact pads are located is coated with a repositionable adhesive. As with the previously described ECMs the vias 304, 306 of the base are filled with an electrically conductive material 308 such as solder or an electrically conductive ink.

On the top surface of the base 282 are mounted the open-side fixed contact pad 288 and the signal-side fixed contact pad 290. In one embodiment the open-side fixed contact pad 288 and the signal-side fixed contact pad 290 are fabricated from conductive metal tape and permanently affixed to the top surface of the base 282. The open-side fixed contact pad 288 and the signal-side fixed contact pad 290 are shaped as rectangular strips with the signal-side fixed contact pad longer than the open-side fixed contact pad. The open-side fixed contact pad 288 and the signal-side fixed contact pad 290 are positioned on the top surface of the base 282 so that there is a gap between them. The open-side fixed contact pad 288 is electrically connected to electrically conductive material 308 to the left via 304 as shown in FIG.

15a while the signal-side fixed contact pad 290 is electrically connected to the electrically conductive material 308 to the right via 306.

Permanently affixed to the top of the base 282 over the open-side fixed contact pad 288 and the signal-side fixed contact pad 290 is the sliding contact spacer 292. The sliding contact spacer 292 is fabricated from card stock having a pre-determined thickness with the same overall width and length as the base 282. The sliding contact spacer 292 incorporates a centered rectangular slot aligned with the long axis of the sliding contact spacer referred to as the sliding contact raceway 310. The sliding contact raceway 310 exposes sections of both the open-side fixed contact pad 288 and the signal-side fixed contact pad 290. Permanently affixed to the upper surface of the sliding contact spacer 292 is the actuator spacer 294. The actuator spacer 294 is fabricated from card stock having a pre-determined thickness with the same overall width and length as the base 282. The actuator spacer 294 also incorporates a centered rectangular slot aligned with the long axis of the sliding contact spacer referred to as the actuator raceway 312. The combined sliding contact raceway 310 and actuator raceway 312 form a stepped channel which is sized to accommodate the actuator assembly 314.

The actuator assembly 314 is composed of the actuator base 296, actuator tab 298, and sliding contact 300. The actuator base 296 and actuator tab 298 are formed from cardstock while the sliding contact 300 is formed from a thick sheet of conducting metal. The width of the actuator base 296 is sized to match the width of the actuator raceway 312 with a length less than that of the actuator raceway 312. The thickness of the actuator base 296 is chosen so as to match the thickness of the actuator spacer 294. The actuator tab 298 has a predetermined thickness and overall shape of a small rectangle. The actuator tab 298 is centered and permanently affixed to the top surface of the actuator base 296 with the actuator tab's long axis aligned with the short axis of the actuator base 296 as shown in FIG. 15a. The width of the sliding contact 300 is sized to fit into sliding contact raceway 310. The length of the sliding contact is sized to match that of the long axis of the actuator base 296. The sliding contact 300 incorporates two dimples, the open-side dimple 316 and the signal-side dimple 318 as shown in FIG. 15a. The open-side dimple 316 and the signal-side dimple 318 are sized such that their depth is equivalent to the thickness of the sliding contact spacer 292. The sliding contact 300 is permanently affixed to the underside of the actuator base 296 such that it is centered with its long axis aligned with the long axis of the actuator base and the dimples in the sliding contact facing down.

The actuator assembly 314 is inserted into the stepped channel formed by the combined actuator raceway 312 and sliding contact raceway 310. In the SPST switch ECM 280 the actuator assembly 314 is free to move in the stepped channel along the long axis of the base 282. When the actuator assembly 314 is moved toward the open-side fixed contact pad 288 the open-side dimple 316 of the sliding contact physically comes into contact with the open-side fixed contact pad 288. Regardless of the position of the actuator assembly 314 in the actuator raceway 312 the signal-side dimple 318 of the sliding contact 300 is always in physical contact with the signal-side fixed contact 290. The spacing of the gap between the signal-side fixed contact 290 and the open-side fixed contact pad 288 is pre-determined so that when the actuator assembly 314 is moved all the way toward the signal-side fixed contact 290 in the stepped channel the open-side dimple 316 is not in electrical contact with the open-side fixed contact pad 288.

Permanently affixed to the top surface of the actuator spacer 294 is the switch cover 302. The switch cover 302 is fabricated from card stock having a pre-determined thickness with the same overall width and length as the base 282. The switch cover 302 incorporates a rectangular slot referred to as the switch window 320 through which when the SPST switch ECM 280 is fully assembled the actuator tab 298 of the actuator assembly 314 protrudes. In one embodiment the top surface of the actuator base 296 incorporates the words "ON" 322 and "OFF" 324 printed on either side of the actuator tab 298 as shown in FIG. 15a. The switch window 320 is sized such that depending on the position of the actuator assembly 314 with respect to the switch window 320 either the full word "ON" 322 or "OFF" 324 is fully visible through the switch window at any given time but not simultaneously. FIG. 15b is a perspective view from above of a fully assembled of SPST switch 280 with the actuator assembly 314 positioned fully toward the signal-side fixed contact pad 290 and the word "OFF" 324 visible through the switch window 320. As described previously, with the actuator assembly 314 in this position the open-side dimple 316 of the sliding contact 300 is not in electrical contact with the open-side fixed contact pad 288 and therefore no current can flow from the signal-side fixed contact 290 to the open-side fixed contact. FIG. 15c is a perspective view from above of a fully assembled of SPST switch 280 with the actuator assembly 314 positioned fully toward the open-side fixed contact pad and the word "ON" 322 visible through the switch window 320. As described previously with the actuator assembly 314 in this position the open-side dimple 316 of the sliding contact 300 is in physical and electrical contact with the open-side fixed contact pad 288 and therefore current or an electronic signal can flow from the signal-side fixed contact 290 to the open-side fixed contact.

The switch cover 302 has printed on its top surface an identification marking 326 which incorporates the switch window 320 and the visible portions of the actuator assembly 314 seen through the switch window 320. As with the previously described ECMs in the current invention the identification marking 326 indicates the location of the contact pads 284, 286 on the underside of the SPST switch 280 through the use of contact pad graphics 328. The identification marking 326 connects the contact pad graphics 328 and the switch window 320 with straight lines to provide the user with enhanced visual feedback on the status of the switch when used as part of a circuit.

In the above described embodiment of the SPST switch ECM 280 the base 282, the sliding contact spacer 292, the actuator spacer 294, the actuator base 296, the actuator tab 298, and the switch cover 302 are fabricated from card stock. The base 282, the sliding contact spacer 292, the actuator spacer 294, the actuator base 296, the actuator tab 298, and the switch cover 302 can be fabricated from any semi-rigid or rigid non-conducting material such as paper, card stock, plastic, or ceramic. However, paper or card-stock provides both a cost advantage and ease of fabrication over other materials. Also, in the above embodiment the open-side fixed contact pad 288 and the signal-side fixed contact pad 290 are fabricated from conductive metal tape. The open-side fixed contact pad 288 and the signal-side fixed contact pad 290 could also be formed from conductive ink printed on the top surface of the base. The disadvantage of using conductive ink lies in the that the open-side fixed contact pad 288 and the signal-side fixed contact pad 290 are subject to friction from the open-side dimple 316 and the signal-side dimple 318 of the sliding contact 300 as the actuator assembly 314 is moved back and forth. The friction could cause the open-side fixed contact pad 288 and the signal-side fixed contact pad 290 to wear out prematurely.

Assembly of a Simple Circuit

Figure 16A:
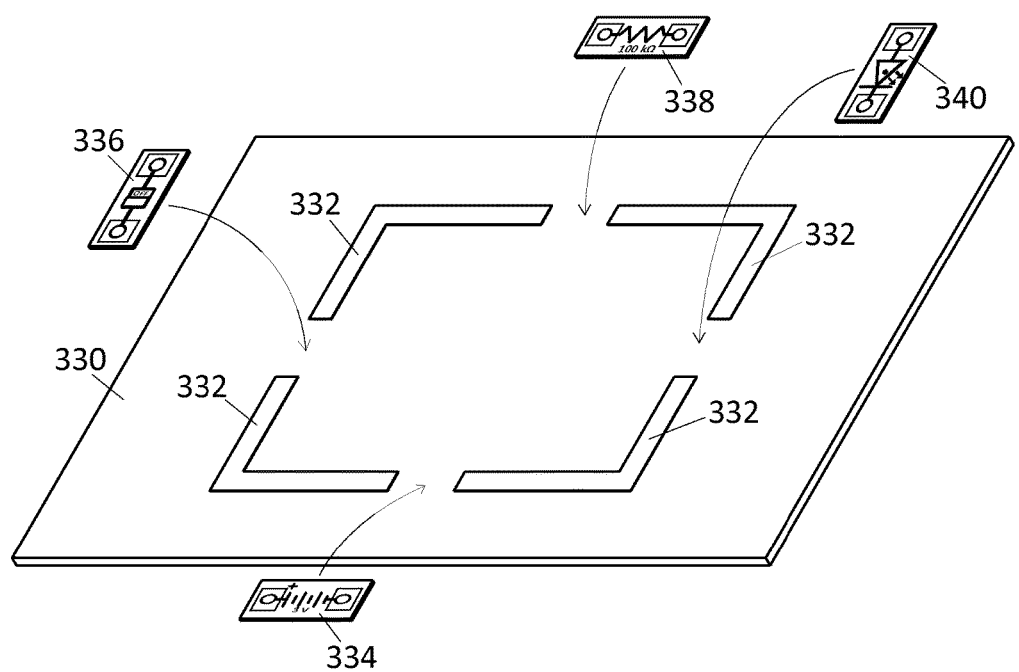
FIG. 16a is a perspective view from above of a simple LED circuit in the process of being assembled using components of the current invention.
Figure 16B:
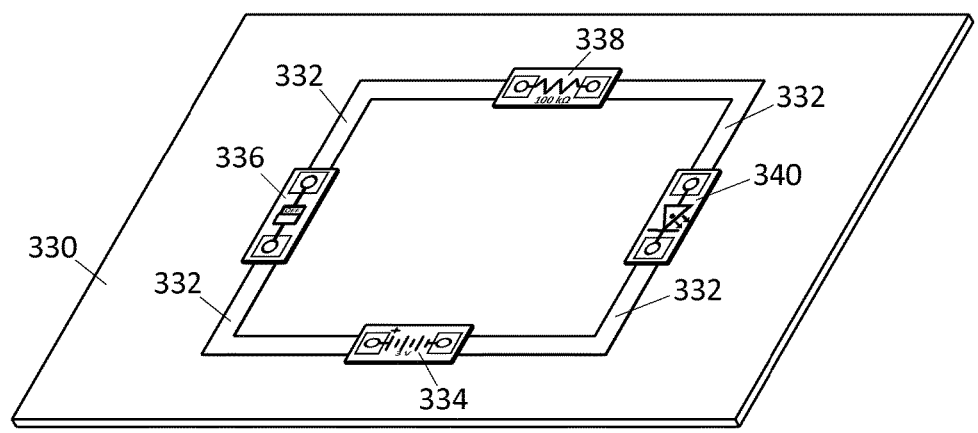
FIG. 16b is a perspective view from above of components of the current invention mounted on a substrate forming a simple LED circuit.

As stated previously the current invention provides a new way in which to lay out, study, and build functioning electronic circuits. Using the electronic component modules (ECMs) described thus far a simple circuit can easily be assembled. FIG. 16a and FIG. 16b shows a simple LED lighting circuit assembled using the current invention. The circuit is assembled on a substrate surface 330. Using the techniques previously described conductive traces 332 are placed on the substrate surface 330 in a manner similar to that shown in FIG. 3. Gaps are left between the conductive traces which correspond to the spacing of the contact pads on the various ECMs to be used in the circuit. The ECMs required to assemble a simple LED lighting circuit minimally comprise of a battery ECM 334, a SPST switch ECM 336, a resistor ECM 338 and a LED ECM 340. FIG. 16a is a perspective view from above of the substrate with conductive traces already affixed and the ECMs being positioned onto the substrate. The ECMs are affixed to the substrate as described above and as shown in FIG. 16b. FIG. 16b is a perspective view from above of the substrate with the conductive traces already affixed and the ECMs mounted on the substrate in electrical contact with the conductive traces. As stated previously the bases of the ECMs are coated with a repositionable adhesive which allows the individual modules to adhere to the substrate while allowing the contact pads of the ECMs to make electrical connections with the conductive traces. Once assembled on the substrate the modules and the conductive traces form a complete electrical circuit. When the SPST switch ECM 336 is manipulated from the "OFF" position to the "ON" position the circuit is closed and current flows from the battery ECM 334, through the SPST switch ECM 336, through the resistor ECM 338, and through the LED ECM 340 lighting the LED.

It is apparent that using the electronic components already discussed and others which are easily integrated into the invention described thus far that a near infinite number of circuits can be constructed utilizing the current invention. The complexity and size of the circuit capable of being assembled utilizing the current invention is limited only by the size of the substrate, the layout of the conductive traces, and the type and number of ECMs available.

Description of Transistor ECM

To build more sophisticated electronic circuits additional electronic components need to be integrated into the current invention. Two such classes of electronic components are transistors and integrated circuits (ICs). Transistors are semiconductor devices with three electrical leads. A very small current or voltage at one lead can control a much larger current flowing through the other two leads. This property makes transistors very useful for building electronic circuits in that they can be used as amplifiers and switches. While there are several configurations of transistors all transistors have three leads. The three leads of a transistor are commonly referred to as the collector, base, and emitter.

Figure 17A:
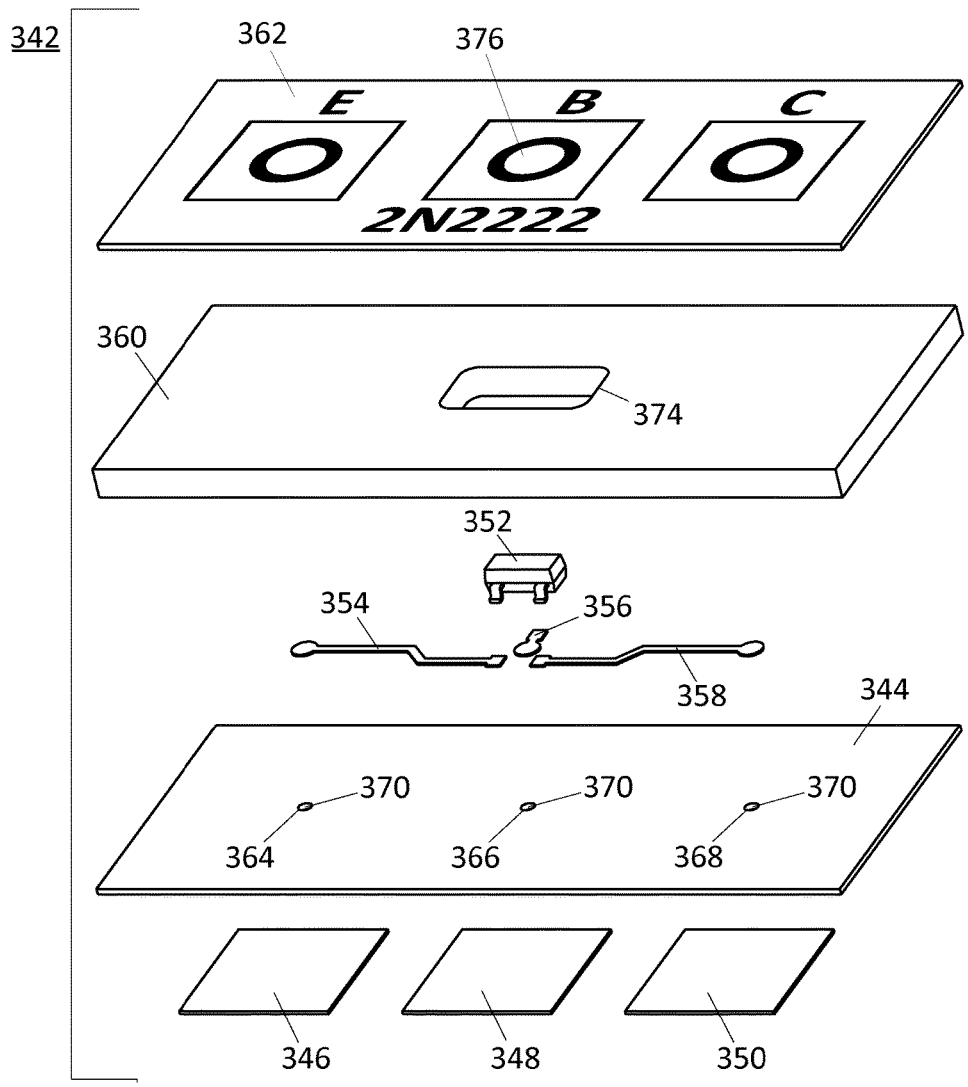
FIG. 17a is an exploded view of a transistor electronic component module.
Figure 17B:
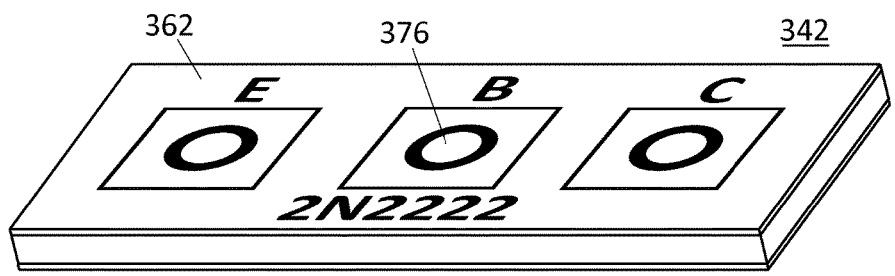
FIG. 17b is a perspective view from above of a fully assembled transistor electronic component module.
Figure 17C:
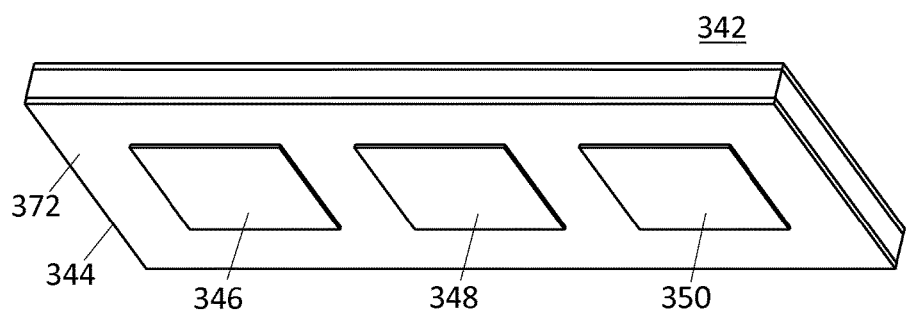
FIG. 17c is a perspective view from below of fully assembled transistor electronic component module.

FIG. 17a, FIG. 17b, FIG. 17c, and FIG. 17d shows an embodiment of the current invention which incorporates a surface-mount transistor, the transistor ECM 342. FIG. 17a is an exploded view of the transistor ECM 342. FIG. 17b is a perspective view from above of the fully assembled transistor ECM 342 and 17c is a perspective view from below of the fully assembled transistor ECM 342. The transistor ECM 342 minimally comprises of a base 344, three contact pads 346, 348, 350, a surface-mount transistor 352, a emitter conduction lead 354, a base conduction lead 356, a collector conduction lead 358, a spacer 360, and a cover 362. As with previously described ECMs of the current invention the base 344 is formed from a rectangular sheet of card stock of predetermined thickness. Three vias 364, 366, 368 are cut into the base 344. The vias are positioned apart from one another along the long axis of the base 344 spaced equally apart with the middle via 366 centered along the long axis of the base 344. As with previously described ECMs of the current invention the vias are filled with an electrically conductive material 370 such as solder or an electrically conductive ink. As with the previously described ECMs the contact pads 346, 348, and 350 are mounted on the underside of the base 344 over the vias 364, 366, 368. As with the previously described ECMs in one embodiment the contact pads 346, 348, and 350 are formed from conductive metal tape cut in a square or rectangular in shape while in another embodiment the contact pads are formed by printing conductive ink on the underside of the base 344. The bottom surface 372 of the base 344 not covered by the contact pads 346, 348, and 350 is coated with a repositionable adhesive.

The emitter conduction lead 354, base condition lead 356, and the collector conduction lead 358 are formed from a conductive ink printed on the top surface of the base 344 such that their ends terminate over the vias 364, 366, and 368 and make electrical contact with the electrically conductive material 370 in the vias. The surface-mount transistor's 352 three leads are electrically and mechanically attached to the conduction leads using solder or a conductive adhesive. In another embodiment of the current invention the emitter conduction lead 354, base condition lead 356, and the collector conduction lead 358 are formed from conductive metal tape.

Permanently affixed to the top of the base 344 over the conduction leads is the spacer 360. The spacer is fabricated from card stock with a thickness minimally equivalent to the height of the surface-mount transistor 352 and the same overall width and length as the base 344. The spacer incorporates a centered rounded rectangular slot 374 aligned with the long axis of the base 344. When the spacer 360 is attached to the base 344 the rectangular slot 374 forms a cavity wherein the surface-mount transistor 352 is positioned.

The cover 362 is fabricated from card stock having a pre-determined thickness with the same overall width and length as the base 344. The cover 362 is permanently affixed to the top surface of the spacer 360. The cover 362 has printed on its top surface an identification marking 376 which can include graphic elements, numbers, letters, and or symbols to identify the surface-mount transistor enclosed, the orientation of the contact pads, and which leads of the surface-mount transistor 352 they are attached too.

Figure 17D:
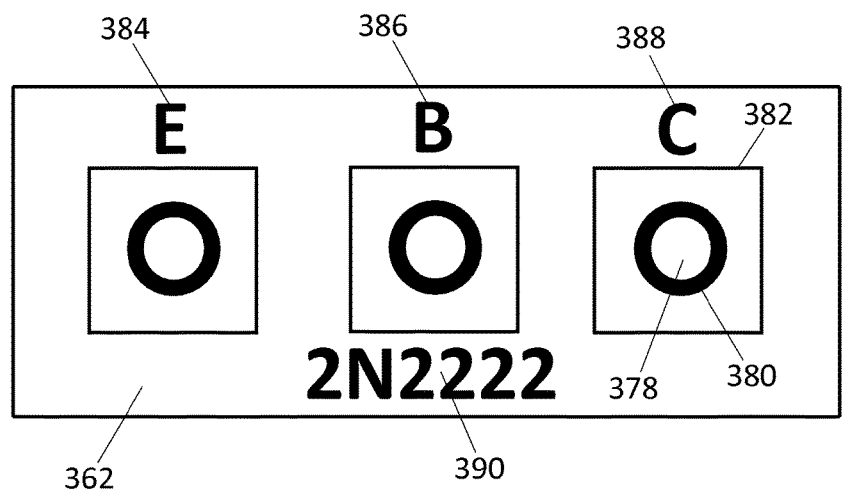
FIG. 17d is a top plan view of a transistor electronic component module displaying typical graphical elements describing the enclosed transistor.

FIG. 17d is a top view of the transistor ECM showing one embodiment of the identification marking for a transistor ECM. The location of the contact pads on the underside of the transistor ECM are indicated by a contact pad graphic element 378 consisting of a circle 380 circumscribed by a square 382. Adjacent to each of the contact pad graphic elements 378 is a letter which identifies which contact pad of the transistor ECM 342 connects to which surface-mount transistor lead of the enclosed transistor. In FIG. 17d, the left contact pad graphic is identified with a "E" 384 which indicates that the left contact pad connects to the emitter lead of the transistor, the center contact pad graphic is identified with a "B" 386 and indicates that the center contact pad connects to the base lead of the transistor, and the right contact pad graphic is identified with a "C" 388 indicates that the right contact pad connects to the collector lead of the transistor. The identification marking 376 also includes an alpha-numeric code 390 which identifies the specific type of transistor mounted in the transistor ECM.

Description of Integrated Circuit ECM

Integrated circuits (ICs) are another class of electronic component necessary to build more sophisticated electronic circuits. Integrated circuits are complex electronic circuits composed of electronic components such as transistors, resistors, and capacitors fabricated on a single silicon chip and packaged in a housing with a fixed number of leads extending from the housing. The leads provide inputs and outputs to the circuit or circuits in the IC. The number of leads on an IC depends on the complexity and number of circuits in the IC. For example, a typical 7400 series logic IC will contain four logic circuits and have 14 leads.

Figure 18A:
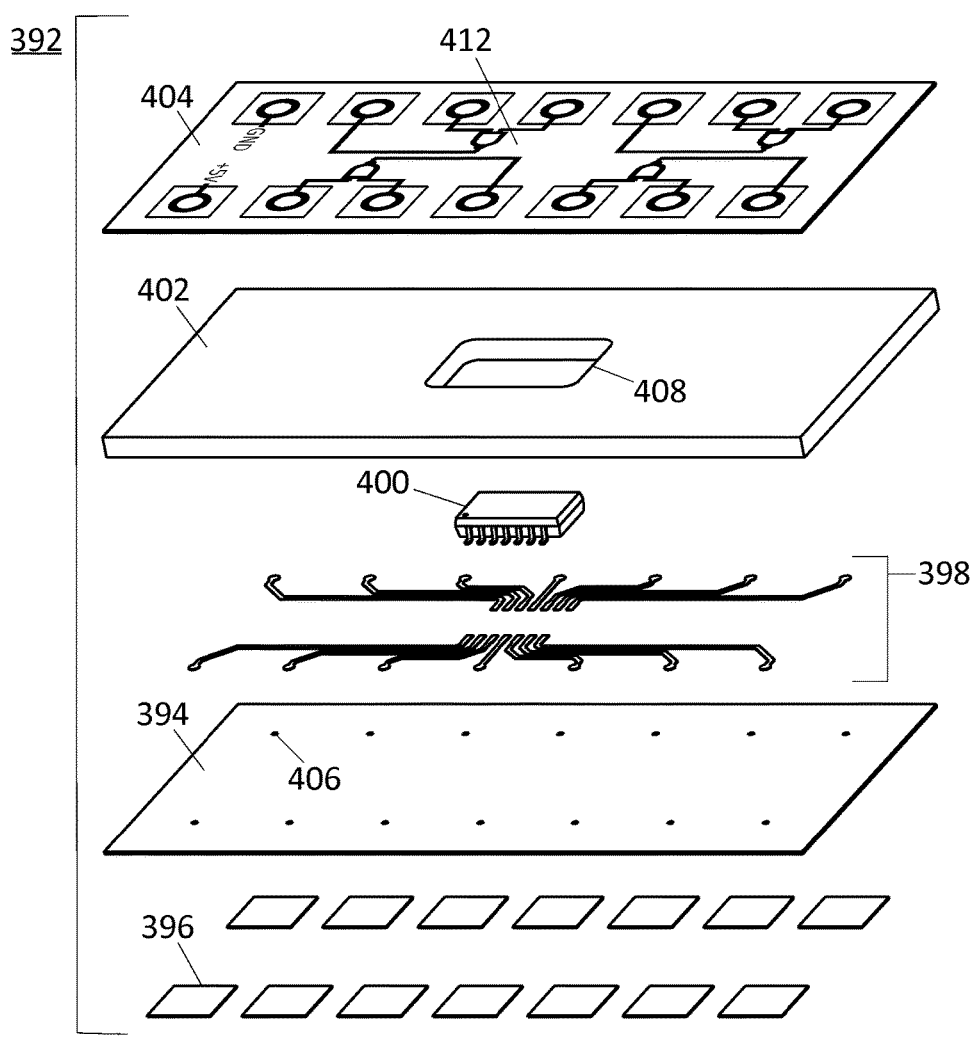
FIG. 18a is an exploded view of a 14 pin integrated circuit electronic component module.
Figure 18B:
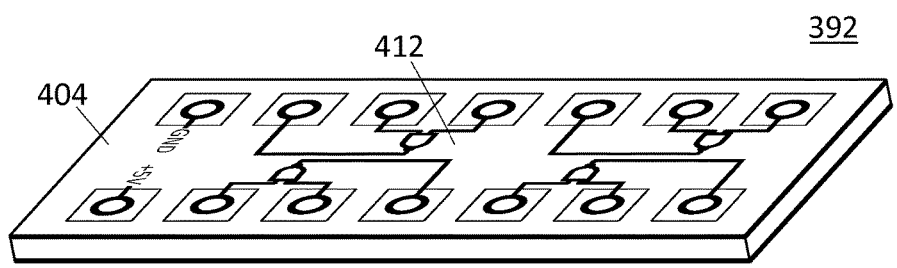
FIG. 18b is a perspective view from above of a fully assembled 14 pin integrated circuit electronic component module.
Figure 18C:
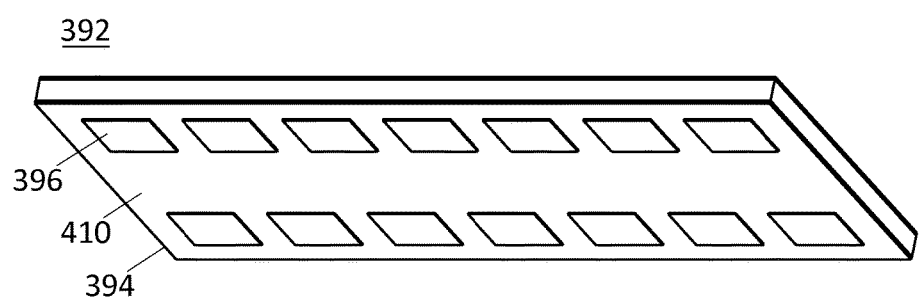
FIG. 18c is a perspective view from below of a fully assembled 14 pin integrated circuit electronic component module.

FIG. 18a, FIG. 18b, and FIG. 18c show an embodiment of the current invention which incorporates a 14 lead surface-mount IC, the 14 lead IC ECM 392. FIG. 18a is a exploded view of the 14 lead IC ECM 392. FIG. 18b is a perspective view from above of the 14 lead IC ECM 392. FIG. 18c is a perspective view from below of the 14 lead IC ECM 392. The 14 lead IC ECM 392 comprises of a base 394, 14 contact pads 396, the IC conduction leads 398, a 14 lead surface-mount IC 400, a spacer 402, and a cover 404.

The base 394 is formed from a rectangular sheet of card stock of predetermined thickness into which a 14 vias 406 have been cut. The vias are distributed in two row of seven oriented along the base's long axis and uniformly spaced as seen in FIG. 18a. As with previously described ECMs of the current invention the vias are filled with electrically conductive material such as solder or an electrically conductive ink. The contact pads 396 are similar to those described in previously ECMs of the current invention. The contact pads 396 are affixed to the underside of the base 394 over the vias 406 and are in electrical contact with the electrically conductive material in the vias. The bottom surface 410 of the base 394 not covered by the contact pads 396 is coated with a repositionable non-conducting adhesive. The IC conduction leads 398 are formed from conductive ink and are formed from conductive ink and printed on the top surface of the base 394 such that the conduction lead ends terminate over the vias 406 and make electrical contact with the electrically conductive material in the vias.

In another embodiment of the current invention the IC conduction leads 398 are formed from conductive metal tape. In the case of the IC conduction leads 398 the individual leads can be delicate enough that producing the IC conduction leads with conductive metal tape may be more difficult than producing the IC conduction leads with conductive ink. The leads of the 14 lead surface-mount IC 400 are electrically and mechanically attached to the IC conduction leads 398 using solder or a conductive adhesive.

The spacer 402 is fabricated from card stock with a thickness minimally equivalent to the height of the 14 lead surface-mount IC 400 and the same overall width and length as the base 394. The spacer 402 is permanently affixed to the top surface of the base 394. The spacer incorporates a rounded rectangular slot 408 centered on the spacer and aligned with the long axis of the base 394. When the spacer 402 is attached to the base 394 the rectangular slot 408 forms a cavity wherein the 14 lead surface-mount IC 400 is positioned. The cover 404 is fabricated from card stock having a pre-determined thickness with the same overall width and length as the base 394. The cover 404 is permanently affixed to the top surface of the spacer 402. The cover 404 has printed on its top surface an identification marking 412 which in accordance with the current invention may include graphic elements, numbers, letters, and or symbols to identify the surface-mount IC enclosed, the orientation of the contact pads 396, and which leads of the surface-mount IC they are attached too.

Figure 19:
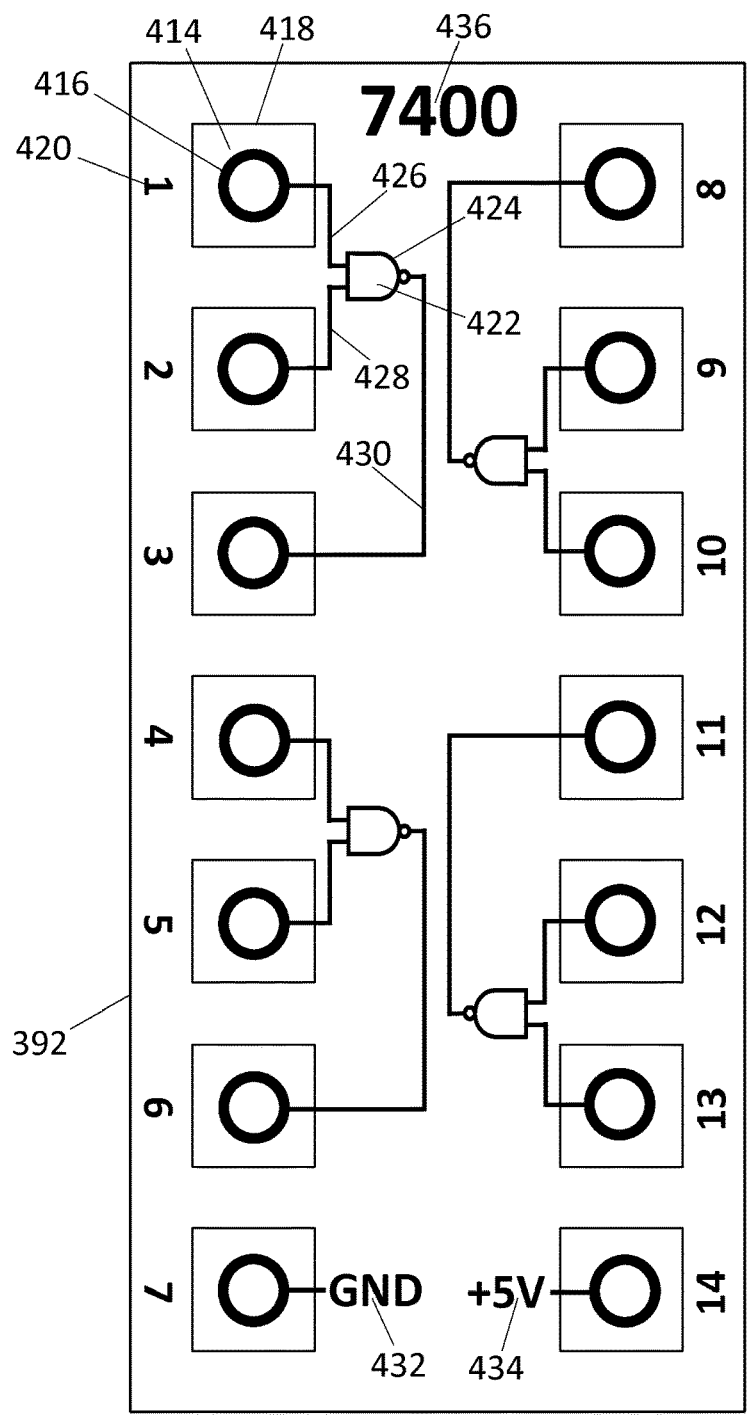
FIG. 19 is a top view of a 14 pin integrated circuit electronic component module displaying typical graphical elements describing the enclosed integrated circuit.

FIG. 19 shows a top view of the 14 lead IC ECM 392 with one embodiment of the identification marking for a IC ECM. In the identification marking the location of the contact pads on the underside of the IC ECM are indicated by a contact pad graphic element 414 consisting of a circle 416 circumscribed by a square 418. Adjacent to each of the contact pad graphic elements 414 is a number 420 which identifies which contact pad of the 14 lead IC ECM 392 connects to which surface-mount IC lead of the enclosed IC. Adjacent to each of the contact pad graphic elements 414 is a number 420 which identifies which contact pad of the IC ECM connects to which surface-mount IC lead of the enclosed IC. The identification marking 412 includes a circuit graphic 422 which identifies the electronic circuit(s) in the IC. The circuit graphic 422 includes an icon 424 and lead lines 426, 428, 430 which identify which contact pads are connected to the various parts of the circuit in the IC. In FIG. 19 the circuit graphic 422 indicates that the IC contains four NAND logic gates. The lead lines 426, 428, 430 of the circuit graphic 422 indicate which contact pads are inputs to the logic gates and which lead lines are outputs. The identification marking in FIG. 19 also identifies which contact pad of the 14 lead IC ECM 392 is connected to the ground lead and the power lead of the IC. The contact pad of the IC ECM connected to the ground lead of the IC is identified by the abbreviation "GND" 432. The contact pad of the IC ECM connected to the power lead of the IC is identified by a character string 434 indicating the polarity and voltage required to power the IC. For example the character string 434 in FIG. 19 "+5V" indicates that the power lead requires a positive five volts to power the IC. The identification marking 412 also includes an alpha-numeric code 436 which identifies the specific type of IC mounted in the IC ECM.

While the above description of the IC ECM focused on a 14 lead variant it is apparent from the above description that the current invention could be extended to accommodate a variety of surface-mount ICs incorporating any geometry or number of leads.

Description of Jumper Wire ECM

As an electronic circuit becomes more complex the layout of the conductive traces between the various electronic components also becomes more complex. As the complexity of an electronic circuit increases a point is reached where it is no longer possible to lay out the conductive traces of the circuit on a substrate without requiring some of the traces to pass over other traces. Having conductive traces pass over other conductive traces is undesirable in that they would be in electrical contact which would lead to an undesirable electronic cross talk between the signals on each trace. In conventional electronic circuits this problem is traditionally resolved by laying out the conductive traces in different physical layers separated by non-conducting material.

Figure 20A:
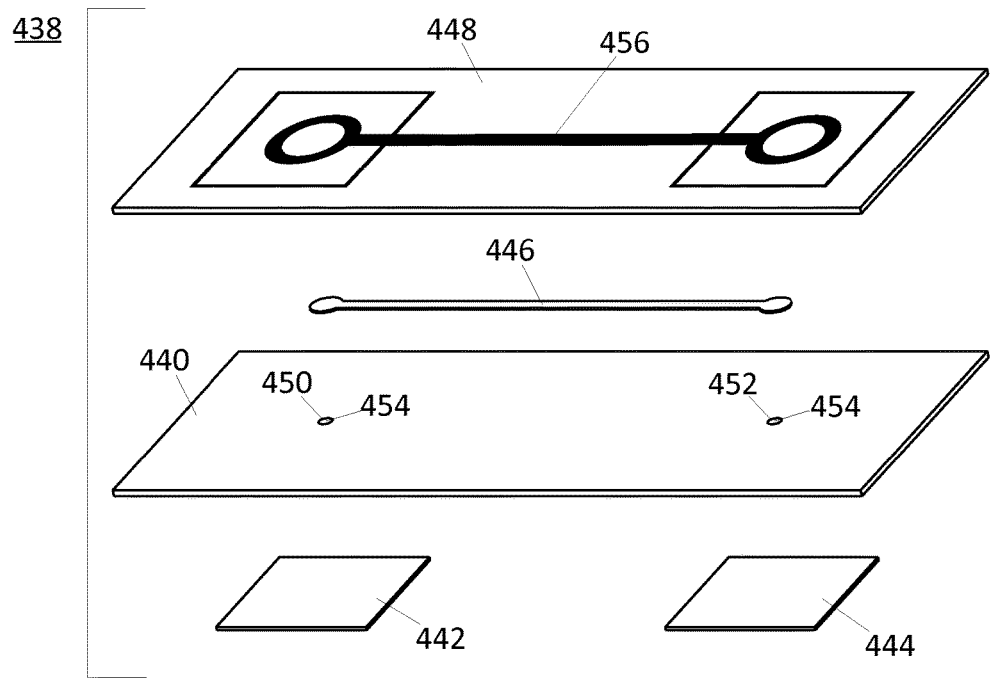
FIG. 20a is an exploded view of a jumper wire electronic component module.
Figure 20B:
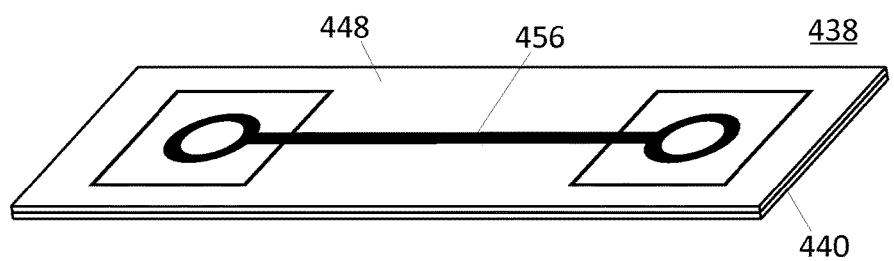
FIG. 20b is perspective view from above of a fully assembled jumper wire electronic component module.

In the current invention one technique to allow conductive traces to pass over other conductive traces is to provide a jumper wire ECM. FIG. 20a shows an exploded view of a jumper wire ECM 438 while FIG. 20b show a perspective view from above of fully assembled jumper wire ECM. The jumper wire ECM 438 comprises of a base 440, a pair of contact pads 442, 444, a conduction lead 446, and a cover 448. As with previously described ECMs of the current invention the base 440 is formed from a rectangular sheet of card stock of predetermined thickness. The base contains two vias 450, 452 with the vias positioned apart from one another along the long axis of the base 282 near either end of the base. As with previously described ECMs of the current invention the vias are filled with electrically conductive material 454 such as solder or an electrically conductive ink. The contact pads 442, 444 are attached to the underside of the base over the vias and in electrical contact with the electrically conductive material in the vias. The contact pads 442, 444 are similar to those described in previously ECMs of the current invention. As with the previously described ECMs in one embodiment the contact pads 442, 444 are formed from conductive metal tape cut in a square or rectangular in shape while in another embodiment the contact pads are formed by printing conductive ink on the underside of the base 440. Also, as with previously described ECMs the underside of the base 440 not covered by the contact pads 442, 444 is coated with a repositionable adhesive.

A single conduction lead 446 is printed using conductive ink on the top surface of the base electrically connecting the electrically conductive material 454 in the two vias 450, 452 and by extension the two contact pads 442, 444. In another embodiment of the current invention the conduction lead 446 is formed from conductive metal tape. While printing with conductive ink is desirable either embodiment is satisfactory. The cover 448 of the jumper wire ECM is fabricated from card stock having a pre-determined thickness with the same overall width and length as the base 394. The cover 448 is permanently bonded to the top of the base 440. Unlike previously described ECM's the jumper wire ECM 438 does not require a spacer since no electronic component of substantial thickness is enclosed by the ECM. However, as with previously described ECM's the top surface of the cover 448 is a marked with an informational graphic 456 which identified the ECM for the user. The informational graphic 456 comprises of two circles circumscribed by squares indicating the location on the underside of the ECM of the contact pads connected by a simple line. A line is a traditional symbol in electronics for a wire. Taken all together the informational graphic 456 communicates to the user that the contact pads of the jumper wire ECM 438 are electrically connected by a simple wire.

Figure 21A:
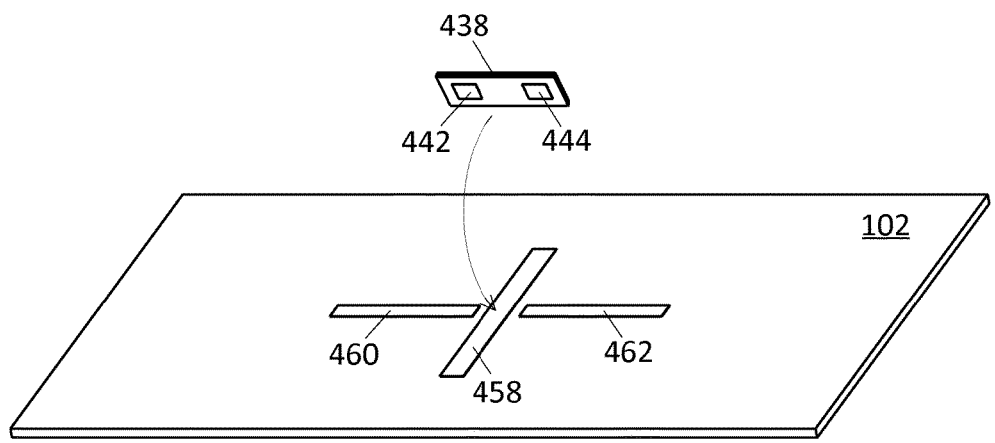
FIG. 21a is perspective view from above of a Jumper Wire electronic component module being affixed to a substrate to facilitate the electrical conduction of one conductive trace over another conductive trace.
Figure 21B:
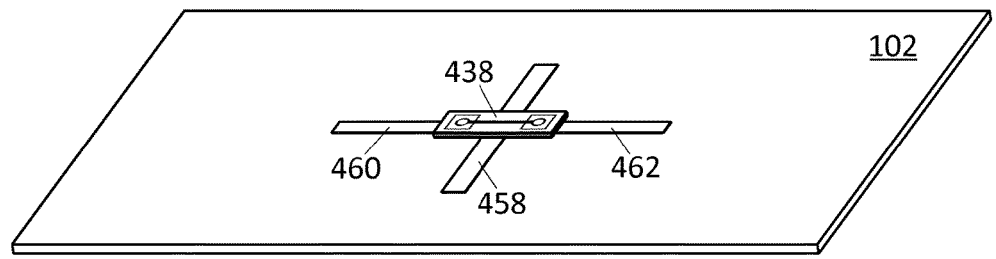
FIG. 21b is perspective view from above of a Jumper Wire electronic component module mounted on a substrate such that it facilitates the electrical conduction of one conductive trace over another conductive trace.

FIG. 21a is a perspective view from above which shows the placement of a jumper wire ECM on a substrate. To use the jumper wire ECM 438 a crossing conductive trace which needs to cross a first conductive trace are positioned on the substrate as shown in FIG. 21a. FIG. 21a shows a first conductive trace 458 and a crossing conductive trace 460, 462 which are two parts of a second conductive trace which needs to cross over the first conductive trace 458. The two parts of the crossing conductive trace 460, 462 are position close to the first conductive trace. FIG. 21b is a perspective view from above of the jumper wire ECM mounted on the substrate.

The jumper wire ECM 438 is positioned over the crossing conductive traces 460 and 462 such that when the jumper wire ECM is affixed to the substrate as shown in FIG. 21b the contact pad 442 is in electrical contact with conductive trace 460 and contact pad 444 is in electrical contact with conductive trace 462. In this manner the jumper wire ECM 438 acts as an electrically conductive bridge over the first conductive trace 458. It is clear from the above description that the jumper wire ECM 438 can facilitates the fabrication of highly complex circuits utilizing the components of the current invention. The jumper wire ECM 438 can be fabricated in a variety of lengths to facilitate longer bridging such as would be required to jumper across multiple conductive traces.

Incorporation of Other Electronic Components into ECMs

It is apparent given the descriptions above of the embodiments of the current invention that the ECMs of the current invention could easily be modified to accommodate a variety of other electronic components not specifically described above such as a speaker, microphone, pushbutton switch, LED or LCD display, photo-resistor, photo-transistor, variable resistor, etc.

Embodiment of ECM with Combined Cover and Spacer

Figure 22A:
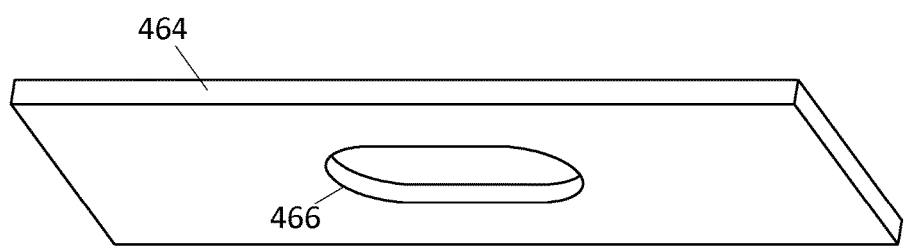
FIG. 22a is a perspective view from below of a combined cover and spacer.
Figure 22B:
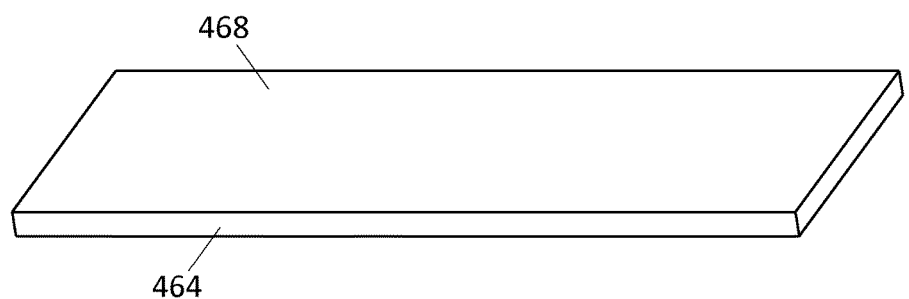
FIG. 22b is a perspective view from above of a combined cover and spacer.

In many of the above described embodiments of the electronic component modules (ECMs) the ECMs were described as including a separate spacer and cover. If the above described embodiments of the ECMs are fabricated from either paper or card stock this is an expected approach as paper and card stock is typically manufactured in sheet form. If however the ECMs of the above described embodiments are fabricated from plastic then the components of the ECMs can be molded. If the components of the ECMs are molded from plastic then in another embodiment of the above described ECMs the cover and spacer can be combined into a single part. FIG. 22a is a perspective view from below of a combined cover and spacer. In FIG. 22a the combined cover and spacer 464 contains a pocket 466 which replaces the hole cut into a spacer to form a cavity around the enclosed electronic component. FIG. 22b is a perspective view from above of the combined cover and spacer. FIG. 22b shows that the pocket 466 on the underside of the combined cover and spacer does not penetrate through the top surface 468 of the combined cover and spacer.

Alternative Geometric Shapes for ECMs

In the above described embodiments of the current invention the ECMs are described as being low profile and predominantly rectangular in shape. In another embodiment the ECMs are low profile and square in shape. In yet another embodiment the ECMs are low profile and circular or disk like in shape. In the current invention the ECMs can be fabricated any planer geometric shape imaginable. In another embodiment the ECMs can be shaped in the form of puzzle pieces. Shaping the ECMs in the form of puzzle pieces allows the user to lock together ECMs in a predetermined fashion onto the substrate.

Fire Retardant Treatment

One concern in using either paper, card stock, or plastic in the above described embodiments is flammability. If an electronic component used in the current invention were to overheat the paper or plastic based components of the above described embodiments could in theory catch fire. To limit the fire hazard risk the voltages, currents, and battery size used in conjunction with the current invention can be limited. Another method by which the fire hazard risk can be mitigated is to treat the materials used in fabricating the above described embodiments with a fire retardant.

Use of Through Hole Electrical Components in ECMs

In the above described embodiments of the electronic component modules (ECMs) of the current invention the electronic components described have been surface-mount components (SMCs). In another embodiment of the current invention the electronic components used are through hole components. Typically when using through hole components the surface on which the component is mounted requires holes to be drilled into it and the component's leads soldered to the surface from below. To adapt through hole electronic components to the current invention require the leads of the through hole electronic components to be attached to the upper surface in a manner similar to that used with the surface-mount components. This can be achieved through bending the leads of the through hole components and soldering or conductively epoxying them directly to the conductive traces on the top surface. The disadvantage to using through hole electronic components is that through hole electronic components tend to be larger and have a taller profile.

Use of Printed Electronic Electrical Components in ECMs

In another embodiment of the current invention the surface-mount components (SMCs) described in the current invention are replaced with printed electronic versions of these electronic components. Printed electronics is a relatively new field of electronics wherein the parts of an electronic components are printed directly on a substrate. Techniques have been developed for printing resistors, capacitors, and transistors as well as other more complex electronic components. A key advantage to using printed electronic components in the current invention includes not having to bond a separate electronic component to the conductive traces as in the above described embodiments of the ECMs utilizing SMCs. When using printed electronic components the components can be printed directly onto the base of the ECM directly along with the conduction leads. Using printed electronic components would also decrease the overall height of certain ECMs in that the spacer described in the above embodiments of the ECM would no longer be necessary.

While the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

I claim:

1. A system for assembling electronic circuits, comprising: connectable electronic components for forming an electronic circuit:
   a substrate comprising a non-conductive surface;
   a set of conductive traces wherein the conductive traces can be deposited on or affixed to said surface of substrate;
   a set of electronic component modules, each of said modules comprising a non-conductive housing portion comprising of a base, spacer, and cover, said base being planar with a plurality of vias connecting the top face of the base to the bottom face, said base having electrically conductive contact pads mounted on the bottom face over each via, said base having a plurality of conductive leads mounted on the top face comprising of a solder pad at one end and a via contact pad at the other end, said conductive leads mounted on the top face of the base such that the via contact pad of each conductive lead is positioned over a via, said vias in base filled with a conductive material such that the contact pads on the bottom face of the base are in electrical contact through the vias to the via contact pads of the conductive leads positioned over the vias on the top surface of the base, said base bottom face coated with a repositionable adhesive except where the contact pads mounted on the bottom face are located, said electronic components being mounted on said base and electronically connected to said conductive leads via the conductive lead's solder pads, said spacer being planar and having substantially the same planer dimensions as the base with a hole connecting the top surface of the spacer to the bottom surface of the spacer, said hole of said spacer being of sufficient dimensions to accommodate the electronic component mounted on the base, said spacer having planer thickness equal to or greater than the height of the electronic component mounted on the base, said spacer permanently attached to top face of base, said cover being planar and having substantially the same planer dimensions as said base, said cover permanently attached to top surface of spacer; at least one of said modules affixed to the substrate with at least one contact pad of said module in contact with a conductive trace deposited on or affixed to said surface of substrate to provide a solderless electronic connection thereto.

2. A system for assembling electronic circuits in accordance with claim 1 wherein said substrate with a non-conductive surface comprises a material selected from the group comprising of plastic, wood, paper, paperboard, card stock, cardboard, fiberglass, and rubber.

3. A system for assembling electronic circuits in accordance with claim 1 wherein said substrate with a non-conductive surface comprises of a metal with a non-conductive laminate or coating.

4. A system for assembling electronic circuits in accordance with claim 1 wherein said conductive traces are formed from a material selected from the group comprising of graphite, conductive ink, conductive glue, conductive epoxy, conductive polymers, and combinations thereof.

5. A system for assembling electronic circuits in accordance with claim 4 wherein said conductive traces are applied to said substrate manually or through mechanical means.

6. A system for assembling electronic circuits in accordance with claim 1 wherein said conductive traces comprise a flexible electrically conductive tape having opposed surfaces and an electrically conductive adhesive coating on one of said surfaces.

7. A system for assembling electronic circuits in accordance with claim 1 wherein said electronic components are selected from the group of: conductive wire, conductive trace, capacitors, resistors, diodes, light emitting diodes LED, inductors, transistors, semiconductors, triodes, power supplies, motors, fans, electronic sound emitters, speakers, buzzers, bells, alarms, microphones, light bulbs, strobe lights, switches, integrated circuits, computer chip, amplifiers, modulators, sensor, solar panels, computer interfaces, telephone interfaces, batteries, printed electronics versions of the afore mentioned electronic components, and combinations thereof.

8. A system for assembling electronic circuits in accordance with claim 7 wherein the electronic components are packaged as surface-mount devices, through hole devices, or other standard electronic device packaging.

9. A system for assembling electronic circuits in accordance with claim 1 wherein said contact pads, conductive leads, and conductive material in the vias are formed from a material selected from the group comprising of flexible electrically conductive tape, conductive ink, conductive glue, conductive epoxy, conductive polymers, and combinations thereof.

10. A system for assembling electronic circuits in accordance with claim 1 wherein said housing comprises a material selected from the group comprising of plastic, wood, paper, paperboard, card stock, cardboard, fiberglass, and rubber.

11. A system for assembling electronic circuits in accordance with claim 1 wherein said cover incorporates one or more holes connecting the top surface of the cover to the bottom surface of the cover to accommodate physical access and or the transmission of light, sound, or electrical signals to or from the electronic component incorporated in the module wherein the hole may be covered or filled with a transparent material.

12. A system for assembling electronic circuits in accordance with claim 1 wherein the cavity formed by said base and the walls of said hole in said spacer is filled with a material selected from the group comprising of non-conducting epoxy, resin, thermosetting plastic, and silicone rubber.

13. A system for assembling electronic circuits in accordance with claim 1 wherein said cover includes markings on the top surface to indicate identification, orientation, and utilization of the said electronic component incorporated in said module.

* * * * *